(12) United States Patent
Cohen

(10) Patent No.: US 12,326,410 B2
(45) Date of Patent: Jun. 10, 2025

(54) ELECTRON SPECTROSCOPY BASED TECHNIQUES FOR DETERMINING VARIOUS CHEMICAL AND ELECTRICAL CHARACTERISTICS OF SAMPLES

(71) Applicant: COZAI LTD, Rehovot (IL)

(72) Inventor: Hagai Cohen, Rehovot (IL)

(73) Assignee: COZAI LTD, Rehovot (IL)

( * ) Notice: Subject to any disclaimer, the term of this patent is extended or adjusted under 35 U.S.C. 154(b) by 415 days.

(21) Appl. No.: 18/002,848

(22) PCT Filed: Jun. 28, 2021

(86) PCT No.: PCT/IL2021/050790
§ 371 (c)(1),
(2) Date: Dec. 21, 2022

(87) PCT Pub. No.: WO2022/003677
PCT Pub. Date: Jan. 6, 2022

(65) Prior Publication Data
US 2023/0288355 A1   Sep. 14, 2023

(30) Foreign Application Priority Data
Jun. 28, 2020   (IL) .......................................... 275693

(51) Int. Cl.
*G01N 23/22* (2018.01)
*G01N 21/64* (2006.01)
(Continued)

(52) U.S. Cl.
CPC ......... *G01N 23/2251* (2013.01); *G01N 21/64* (2013.01); *G01N 23/2273* (2013.01);
(Continued)

(58) Field of Classification Search
CPC ............... G01N 23/2251; G01N 21/64; G01N 23/2273; G01N 2223/079;
(Continued)

(56) References Cited

U.S. PATENT DOCUMENTS 4,144,488 A    3/1979   Haas
4,748,325 A *  5/1988   Slodzian ............... H01J 37/026
                                                          250/282

(Continued)

FOREIGN PATENT DOCUMENTS

JP          4843506 B2    12/2011
JP          6363219 B2     7/2018
(Continued)

OTHER PUBLICATIONS

International Search Report and Written Opinion dated Oct. 22, 2021 for corresponding International Application No. PCT/IL2021/050790.

(Continued)

*Primary Examiner* — Nicole M Ippolito
(74) *Attorney, Agent, or Firm* — Tarolli, Sundheim, Covell & Tummino LLP

(57) ABSTRACT

A measurement system and method are presented for measuring one or more parameters of a sample. The measurement system comprises an excitation system and a detection system. The excitation system is configured to generate combined exciting radiation comprising one- or multi-parameter modulation of multiple exciting signals of different types to be applied to at least a portion of a sample under measurements to thereby induce electron emission response of said at least portion of the sample to said combined exciting radiation. The detection system is configured for detecting the electron emission response of the at least portion of the sample and generating measured data indica- (Continued)

tive of a modulated change of an electrical state of the at least portion of the sample, thereby enabling determination of one or more parameters of the sample from the measured data.

57 Claims, 10 Drawing Sheets

(51) Int. Cl.
*G01N 23/2251* (2018.01)
*G01N 23/2273* (2018.01)
*G01R 31/30* (2006.01)
*G01R 31/307* (2006.01)

(52) U.S. Cl.
CPC ..... *G01R 31/307* (2013.01); *G01N 2223/079* (2013.01); *G01N 2223/085* (2013.01); *G01N 2223/304* (2013.01); *G01N 2223/306* (2013.01); *G01N 2223/405* (2013.01); *G01N 2223/6116* (2013.01)

(58) Field of Classification Search
CPC ....... G01N 2223/085; G01N 2223/304; G01N 2223/306; G01N 2223/405; G01N 223/6116; G01R 31/307
See application file for complete search history.

(56) References Cited

U.S. PATENT DOCUMENTS

| | | | |
|---|---|---|---|
| 6,515,282 B1* | 2/2003 | Veneklasen | G01R 31/305 250/311 |
| 6,720,556 B2 | 4/2004 | Cohen | |
| 7,148,478 B2 | 12/2006 | Cohen | |
| 8,507,853 B2 | 8/2013 | Cohen | |
| 2006/0192150 A1 | 8/2006 | Demos | |
| 2007/0045534 A1 | 3/2007 | Zani | |
| 2007/0235650 A1 | 10/2007 | Federici | |
| 2008/0142707 A1 | 6/2008 | Barnard | |
| 2011/0206187 A1 | 8/2011 | Lee | |
| 2011/0210246 A1 | 9/2011 | Cohen | |
| 2011/0272576 A1 | 11/2011 | Otaki | |
| 2014/0306121 A1 | 10/2014 | Ward | |
| 2019/0204749 A1 | 7/2019 | Tel | |
| 2023/0243766 A1* | 8/2023 | Cohen | G01R 31/307 250/307 |

FOREIGN PATENT DOCUMENTS

| | | |
|---|---|---|
| WO | 05038469 A2 | 4/2005 |
| WO | 19164454 A1 | 8/2019 |

OTHER PUBLICATIONS

Givon, Alon, et al, "Contactless derivation of inner fields in gate-oxide layers: SiO2 on SiC", Applied Physics Letters 107, 173101 (2015).

Kantor-Uriel, Nirit, et al, "Dark and photo-induced charge transport across molecular spacers", Journal of Vacuum Science & Technology B 36 (4), 04H104 (2018).

Shabtai, K., et al, "High Resolution Lateral Differentiation Using a Macroscopic Probe: XPS of Organic Monolayers on Composite Au—SiO2 Surfaces", J. Am. Chem. Soc. 122, 4959-4962 (2000)—Abstract attached.

* cited by examiner

ELECTRON SPECTROSCOPY BASED TECHNIQUES FOR DETERMINING VARIOUS CHEMICAL AND ELECTRICAL CHARACTERISTICS OF SAMPLES

RELATED APPLICATIONS

The present application is a U.S. National Stage application under 35 USC 371 of PCT Application Serial No. PCT/IL2021/050790, filed on 28 Jun. 2021, which claims priority from IL Application Serial No. 275693, filed on 28 Jun. 2020, the entirety of each of which is incorporated herein by reference.

TECHNOLOGICAL FIELD

The present invention is generally in the field of electron spectroscopy, and particularly relates to contactless and nondestructive techniques for characterizing and testing samples. The invention is particularly useful as a tool for process control of integrated circuits (IC) for characterizing and testing wafers in the semiconductors industry.

BACKGROUND

In electron spectroscopy techniques the energy and amount of electrons emitted from a sample irradiated by e.g. X-rays, or charged particles, are measured and analysed to determine characteristic features of the sample. For example, characteristic energies of the emitted electrons can be used to identify chemical elements from which the sample is composed, and can be thus used to determine its chemical composition. Such electron spectroscopy techniques can be used to obtain information from the specific atomic layers (for example, within 20 nm depth, which can be increased or decreased e.g., using synchrotrons), depending on the kinetic energy of the emitted electrons. The electron spectroscopy techniques typically used for locating, identifying, and quantifying chemical consistency of samples are based on X-ray photoelectron spectroscopy (XPS), Auger electron spectroscopy (AES) and possibly additional related techniques.

In XPS, x-rays of well-defined energy are used to irradiate the sample to cause emission of core electrons from atoms at the irradiated surface of the sample. The incident X-rays typically penetrate deep into the irradiated sample, but only electrons emitted from atoms near the surface of the sample can escape and reach the analyser without losing energy on the way. The difference between the energy of an exciting X-ray and the kinetic energy of an emitted electron is used to determine the binding energy of the initial state of the excited electron, which is used to determine the composition of the irradiated sample. XPS can be thus used to identify chemical elements and their oxidation states in a sample surface, based on the spectrum of electrons emitted therefrom.

In AES the sample can also be irradiated by a focused electron beam (a few tens of nanometers) of several keV. In this spectroscopy, a core level vacancy is temporarily created in the excited atom. As the vacancy is filled by an outer orbit electron, the excess energy associated with this transition may be transferred to another electron (Auger electron) responsively emitted from the sample. The kinetic energy of the emitted Auger electrons is measured and analysed to determine characterising features of the excited atoms. AES that is operated with an electron beam input source typically provides better spatial resolution, allowing characterisation of smaller regions of the sample surface, but in AES the sample is more susceptible to surface damages due to additional processes initiated by high energy bombarding electrons.

Sample charging distorts the spectrum of emitted electrons and therefore impacts the sensitivity and precision of e.g., XPS and AES based techniques. In XPS, for example, positive charging is an inherent artefact, to which charge compensation means are frequently used, such as an electron flood gun (eFG) that can neutralize the positively charged surface. In turn, control over the charging conditions can be used to explore the electrical properties of a sample.

Some earlier electron spectroscopy techniques developed by the inventor of the present application are described in the following patents, all assigned to the assignee of the present application.

U.S. Pat. No. 6,720,556 disclosed a method of examining a sample, including: performing a first spectroscopic analysis of a surface portion of the sample when the sample surface portion is in a first electrical charge state; placing the sample surface portion in a second electrical charge state that is different from the first electrical charge state and performing a second spectroscopic analysis of the surface portion of the sample when the sample surface portion is in the second electrical charge state; and comparing the first spectroscopic analysis result with the second spectroscopic analysis result to obtain at least one of structural and electrical information about the sample.

In particular, the above method was applied to patterned surfaces, thus demonstrating nm-scale resolving power of surface species, obtained by the macroscopic XPS-based tool. [K. Shabtai, I. Rubinstein, S. R. Cohen and H. Cohen, "High Resolution Lateral Differentiation Using a Macroscopic Probe: XPS of Organic Monolayers on Composite $Au$—$SiO_2$ Surfaces", *J. Am. Chem. Soc.* 122, 4959-4962 (2000).]

U.S. Pat. No. 7,148,478 describes a method and device for measuring the electrical properties of a specimen. The specimen is excited with high energy radiation to cause emission of internal charged particles from the specimen. Electrical power is supplied to a circuit, that is formed by the specimen and any added component connected to a back contact of the specimen. The electric power supply includes at least one of the following: irradiating the circuit with electrically charged particles; subjecting the circuit to an external field of the kind affecting the flux of emitted internal charged particles; and supplying a bias voltage to the back contact of the specimen. During the power supply to the specimen, at least one of the following is carried out: an electric current through the specimen is measured, and the emitted charged particles are analysed versus their energy (using a contactless voltmeter) which provides local potential values at chemical entities of the specimen.

U.S. Pat. No. 8,507,853 describes system and method for depth profiling with improved accuracy and reliability. The method comprises obtaining spectroscopic data from the sample while under at least two different electrical conditions of the sample, the spectroscopic data comprising a signal of charged particles emitted from the sample, and being indicative of a change in amplitude, spectral position and spectral shape of the signal from the sample while under different electrical conditions of the sample, the change being indicative of the compositional profile and spatial distribution for at least one chemical element in the sample along a direction through the sample.

GENERAL DESCRIPTION

Front-end integrated circuits design rules for size shrinking have recently reached sub 10 nm levels by applying innovative photo-lithographical methods, such as multiple exposure by deep UV (for example at 193 nm wavelength) and extreme UV (EUV, e.g. at 13.5 nm wavelength). The CMOS technology (Complementary Metal Oxide Semiconductors) production involves printing small features, mostly for field-effect transistors (MOSFET) in logic IC or memory cells. However, MOSFET transistors size shrinking has recently reached some physical limits, which became harder to control, including FET gate critical dimensions (CD), line edge roughness, layers overlay issues, thickness variations and more.

At the same time, the traditional process control methods, such as optical or EM (electron microscopy) based techniques, have reached their limits to provide sufficient data on the IC performance and, therefore, production yields have deteriorated to risky levels.

Moreover, the demands as of IC performance include strict requirements for stable transistor switching at low voltage, with minimal leakage current at the CMOS gate level, in addition to the trivial implications of leakage currents on power consumption, device speed and stability.

Approaches towards shrinking the gate size are also accompanied by innovative geometries to minimize leakage and instability, such as surrounding the 3D gate by conductive fins (finFET) or even 'all around' the gate (GAA). In particular, the dielectric layers have shrunk in size, therefore requiring thinner layers with high dielectric constant (high K), selected to avoid break-down of the gate's insulating layer.

Finally, high-K dielectrics, mostly $HfO_2$, but also $SiO_2$, SiOxN and others, are in general very difficult to control after the IC printing process. Hence, since no current process control technology can tackle properly this recent crisis, a new innovative method is imperative.

Independently and emerging from a different field of technology, there is a need in the art for a novel approach for measuring various parameters/conditions of articles/samples utilizing the general principles of XPS-based electron spectroscopy.

Indeed, electron spectroscopy has inherent sensitivity to electrical properties of inspected specimens. Previous technologies like controlled surface charging (CSC) and chemically resolved electrical measurements (CREM) utilize inner electric fields in a sample to improve chemical analysis, or utilize derived chemical information to obtain various electrical properties being measured. XPS, which was originally developed for chemical analyses of surfaces, is capable of diverse electrical measurements, including I-V curves of selected domains, photovoltage measurements at specific sample's sites, advanced work function measurements, and more.

The inventor has shown that the ability of CREM to perform electrical tests without any top-contact can be used to introduce electrical quality control at early stages in a device production. This allows direct access to the actual key properties of the device and, thus, reduces the need in metrology characterization techniques. However, the CREM throughput is far from being sufficient for industrial applications.

Also, the miniaturization of device elements, down to the scale of a few nanometers, complicates direct inspection of each element (e.g. transistor by transistor) by known inspection techniques (typically, optical inspection and electron beam inspection). This is associated, inter alia, with a requirement for higher spatial resolution of measurements, which is essential for measurements in multi-layer/multi-component samples having very small features, for example such as semiconductor wafers. In this regard, it should be noted that there is a need to increase spatial resolution of measurements in both lateral axis (across the sample) to apply measurements to very small features (memory cells, transistors, etc.), and vertical axis (through the sample) to selectively probe shallow and deep layers. Also, various industrial applications require relatively fast and high-quality (high accuracy) measurements in such complex samples having multiple patterns of small features. For example, the invention provides for fast testing of such structures as memory cells. Memory cells include volatile and non-volatile types: volatile memory include Random Access Memory (RAM), static RAM (SRAM), and cache memory. Fast determination of electric characteristics and latency need to be known at an early stage. The technique of the present invention is particularly useful for measurement of non-volatile memory types such as flash memory types NAND and NOR.

The present invention provides a novel electron spectroscopy based measurement technique which can be used to characterize chemical consistency and/or examine small structures (e.g. nanostructures) formed in atomic layers of a sample; and provide data indicative of electrical properties of the sample including global and local properties. The novel approach of the present invention utilizes large area detection that, in some of its modes, is sensitive enough to identify a failure at a single element out of many.

According to some aspects of the invention, it provides a novel technique for measuring the work function of a sample. The novel approach of the invention for work function measurements provides for eliminating the artefacts, associated with negative or positive charging of a sample, which unavoidably exists in and thus impedes the measurements based on the conventional approach.

The invention also advantageously provides for detection, in a non-contact mode, of spontaneous electric charge leakages in capacitive elements like CMOS gates and memory cells of a tested sample. This may be implemented using short scans along a desired time schedule.

According to some other aspects of the invention, it provides for measuring various chemical and/or electrical properties/parameters of a sample by subjecting the sample (or at least a region thereof) to a plurality of excitations of different types, including high energy radiation excitation (e.g. X-rays radiation, or electron beam excitation), and one or more of the following additional excitations: relatively low-energy ion radiation; relatively low-energy e-radiation (e.g. flood gun radiation) being so-called "wide" electron beam radiation (unfocused electron beam); focused electron beam irradiation; excitation by light illumination including one or more optical beams; and possibly also excitation by electrical biasing of the sample (i.e. electric power supply).

It should be noted that the term "high energy radiation" used herein should be interpreted broadly covering electromagnetic radiation but also high energy charged particles. Such high-energy radiation (of both of these types) applies for a flexible range of energies, e.g. 0.1-10 keV.

These excitations include at least one excitation which is modulated in a predetermined manner allowing detection/monitoring of one or more of such properties of a sample (at least a portion of the sample) as: tests of the integrity of electrical conductors/leads in a surface pattern of the sample (including non-top-contact tests); refined work function (WF); as well as combination of optical measurements and CREM.

In some embodiments of the invention, at least two excitations are modulated in a predetermined manner. This provides for measurements/monitoring of one or more of such properties of at least a portion of the sample (e.g. in combination with any one of the above properties) as: I-V and V-V characteristics; small spot XPS; soft breakdown of elements (a non top-contact test mode).

The use of multiple excitations, including modulated excitation(s), causes an effective combined response of the sample, which can be appropriately detected by a detection system including an electron spectrometer (analyzer and detector), and possibly also an ammeter, and in some embodiments may also include an optical detector for detecting sample's reflection/scattering of illumination and/or luminescence excited/induced by the various excitation sources. The effective response of the sample (e.g. an electron emission response of the sample, and/or sample's response via a change of electric current through the sample) to the multiple excitations is indicative of a modulated change of electrical state of at least a region of the sample. Data indicative of the measured response can be processed, utilizing the known modulation of said at least two excitations, to determine parameter(s)/condition(s) of said at least region of the sample.

Example of suitable excitation modulations are as follows: The modulated wide electron beam may have a current amplitude modulation at certain frequency(ies) and/or kinetic energy (i.e. landing energy) modulation/adjustment at certain frequency(ies). In case of optical beam modulation, this may include modulation in amplitude and/or the source wavelength around a selected wavelength (e.g. within the range of 200 nm-1800 nm; for example wavelength modulation around a sample's resonance condition, preferably in the visible regime 380-700 nm) and/or polarization and/or temporal frequency (i.e. repetition rate) modulation. If more than one optical beams are used, they may include beams differing from one another in at least one of these parameters. Electric biasing modulation may be implemented by varying the sample bias value (voltage) according to a predetermined time function, which may also be used to induce an effect similar to sample's excitation by modulated flood gun e-radiation.

Thus, this novel approach of the present invention is based on the use of predetermined one- or multi-parameter modulation of multiple excitations (exciting signals) of different types being applied to a sample (at least a portion thereof) under measurements. Moreover, two or more measurement sessions with such multiple modulated excitations can be performed while under different charging conditions of the sample (e.g. different biasing of the sample).

This approach provides for performing relatively fast and high-accuracy measurements of various material- and electric properties related parameters and conditions of the sample, which may advantageously be used for automatic inspection of samples, e.g. samples progressing on a production line, for example for purposes of device R&D, or process control with respect to manufacturing process being applied to the sample. Further, this technique, when being applied to samples progressing on a production line, may be used to identify "defective" samples and properly sort them.

Such fast and accurate electric- and material-related measurements may be combined with optical measurements. For example, for samples of the type which are allowed to be charged during optical inspection/measurements or electron beam inspection/measurements, a measurement system of the present invention can be used together with (or may be integral with) an automatic optical inspection equipment.

In some examples of such combined measurements/inspections, the present invention can be used for performing preliminary automatic "electric" inspection, which might eliminate or significantly reduce the number of samples for automatic optical inspection to identify "potentially defected" samples. Alternatively or additionally, the electric measurements of the present invention can be used for performing preliminary verification of the sample's performance and status with regard to those samples which have been classified by the automatic optical inspection as "potentially defective" and thus requiring further manual verification by a more complex engineering inspection tool. Indeed, some of such "potentially defected" samples identified by optical techniques might appear to be non-defective in their electric properties, and vice versa, which might be indicative of the probing techniques, thus eliminating false results by the inspection/verification tool.

Further, it should be noted that since the present invention actually utilizes measurement of a sample's response (radiation signature) to modulated excitation (i.e. including one or more modulated exciting signals), machine learning techniques can be appropriately used to determine a relation (correlation) between (a) radiation signatures obtained in response to predetermined sets of excitation conditions for predetermined samples (i.e. radiation signatures corresponding to measurement modes) and (b) the sample's electric and material-related parameters. Such data may be used to create a database, and may then be used for automatic inspection by measuring radiation signature for a certain sample under certain excitation conditions and obtaining a matching set of sample's parameters from the database. Moreover, considering combining the measurements of the present invention with various other types of measurement/inspection techniques (e.g. optical measurements), machine learning can be used to determine correlation between all acquired signatures (responses) of samples of various types. This enables to utilize a matching condition between the measured signatures of a certain sample to determine various parameters of the sample that cannot be directly derived from the single-type measurements.

According to one broad aspect of the invention, there is provided a method for measuring parameters of a sample, the method comprising:

performing at least one measurement session on the sample and obtaining at least one corresponding measured data, wherein said performing of the measurement session comprises: exciting at least a portion of the sample by multiple excitations of different types comprising a predetermined number of excitations each having a predetermined modulation profile, said multiple excitations comprising high energy radiation, and one or more of the following: an ion beam of relatively low energy, e-radiation comprising at least one wide electron beam, e-radiation comprising at least one focused electron beam, illumination comprising one or more light beams, and a bias voltage; detecting a combined effective response of said at least portion of the sample to said multiple excitations comprising at least electron emission spectroscopy of said at least portion of the sample; and generating the measured data indicative of the detected combined effective response, processing said measured data and determining one or more parameters of the sample within said at least portion of the sample.

It should be understood that the term "effective response" used herein signifies that the effect of the combined excitation of a sample can be evaluated/measured by a direct response of the sample constituted by electron emission from the sample (secondary electron emission and/or photoelectron emission and/or Auger electron emission) or may also be evaluated/measured by a detectable change of an electric parameter of the sample, e.g. electric current through the sample, or by a detectable optical signal. It should also be understood that different exciting signals are of different types and thus differently affect the sample, such that responses of the sample to these different exciting signals are indicative of various different information pieces about the sample, forming together a combined effective response embedding multiple data about the sample.

The use of multiple predetermined modulations of exciting signals enables accurate extraction of the information embedded in the combined effective response.

As described above, the predetermined number of excitations includes one or more excitations, depending on the parameters/properties of the sample to be determined According to another broad aspect of the invention, it provides a measurement system for measuring one or more parameters of a sample, the measurement system comprising:

an excitation system configured and operable to generate combined exciting radiation comprising one- or multi-parameter modulation of multiple exciting signals of different types to be applied to at least a portion of a sample under measurements to thereby induce electron emission response of said at least portion of the sample to said combined exciting radiation;

a detection system for detecting the electron emission response of said at least portion of the sample and generating measured data indicative of a modulated change of an electrical state of said at least portion of the sample, thereby enabling determination of one or more parameters of the sample from said measured data.

According to yet another broad aspect of the invention, it provides a measurement system comprising:

an excitation system comprising a plurality of excitation sources generating excitations of different types comprising a high energy radiation source generating high energy radiation and at least one of the following: an ion beam source; a flood gun generating e-radiation in the form of a wide electron beam; an electron beam source generating e-radiation in the form of a focused electron beam; a light source generating illumination including one or more optical beams; and an electric power supply providing one or more bias voltages to a sample;

a signal modulation system comprising a predetermined number of modulators associated with a respective number of said excitation sources, thereby providing that the respective number of excitations is modulated in a predetermined manner;

a detection system comprising at least an electron spectrometer and being configured and operable for detecting an effective response of at least a region of the sample to the multiple excitations and generating measured data indicative of the detected effective response, which is indicative of a modulated change of electrical state of at least said region of the sample;

a control unit configured for signal communication with the detection system to process the measured data and determine one or more of the parameters/conditions of said at least region of the sample.

As described above, the detection system may also include an electric current measurement assembly (ammeter) for measuring electric current through the sample. Alternatively or additionally, the detection system may include optical detector(s) for detecting reflection/scattering of the illumination and/or light emission from the sample induced by one or more of the above excitations.

It should be noted that the present invention may utilize any suitable high energy radiation, capable of inducing electron emission. In particular, the invention utilizes X-ray radiation, and is therefore described hereinbelow with respect to such type of high energy particles' radiation, and the system and technique of the invention are at times referred to hereinbelow as XPS-based system/technique. It should, however, be understood that the principles of the invention are not limited to X-ray radiation and are similarly applicable for any other type of high energy radiation (e.g. electron sources of sufficiently high energy) suitable to excite a sample to induce electron emission from the sample.

The technique of the invention utilizing multi-parameter modulation of excitation signals allows for extracting local information about small features of the sample from various small locations across and through the sample. By correlating changes in the detected signal(s) with the modulated excitation signals, it is possible to extract derivatives of the detected signal(s) which provide for enhanced sensitivity, either to small spatial domains or to specific sample's properties, depending on the selection of modulation(s). For example, a typical XPS incident radiation (on sample) spot size is 10-500 μm, where "small spot size" can be in the range of 10 nm up to a few microns only—two orders of magnitude smaller.

Indeed, the invention provides for modifying the configuration and operation as a CREM-based system to use a so-called "small spot" modulated excitation(s). This results in high spatial resolution of location data (1D, 2D and 3D), which provides for improvement of chemical analysis of the sample, as well as monitoring electrical properties of the sample, i.e. provides 3D XPS mapping of chemical and electrical properties of the sample.

Considering measurements of local (small area) electrical properties, these include: non top-contact I-V and/or V-V characteristic of the sample (the invention provides lateral resolution far below the XPS probe size); vertically and/or laterally resolved electrical properties such as electrostatic potential mapping; soft breakdown detection of elements using a non top-contact breakdown test mode; local work-function values in a heterogeneous surface; non-top-contact tests of the integrity of electrical conductors/leads in a surface pattern of the sample.

In some embodiments, the electrical measurements provide sample's I-V and V-V characteristics via e.g. setting the X-ray source and the eFG to operate under fixed conditions, while the sample bias is scanned and two detection units are operated simultaneously: the ammeter for reading the sample current and the spectrometer for reading the spectrum of emitted electrons. A way of data presentation can, for example, be used by showing two complementary plots, the V-V characteristics, i.e. surface potential ($V_S$) as a function of sample bias ($V_B$), and the I-V characteristics, i.e. sample current (I) vs surface potential. The latter presents two measured signals while the input signal itself, the sample bias, is not shown. It should be noted that, by measuring line-shifts of different XPS signals, different $V_S$ values are obtained for each current value, thus providing a means for resolving potentials at selected sample's locations.

A variety of options can be used for recording electrical sample's properties in a non-top-contact manner, exploiting the instrumental control over different parameters of input signals. As an example, by varying different parameters of the low-energy electron source, it is possible to selectively control the flux of incoming electrons and, separately, the kinetic energy of these electrons. A dedicated experimental protocol can thus be used for charge-trap spectroscopy, in which the energy levels of trap states are extracted. This feature is obtained by following the dependence of the hysteresis in the I-V curves on the kinetic energy of injected electrons. Theoretically, the hysteresis magnitude (i.e. the area surrounded by the curve) should show a maximum when the trap energy above the top of sample's valence band, $E_T$, is equal to the sum of the sample's affinity, $E\phi$, and the kinetic energy, Ek, of the injected electrons, namely $E_T=E\phi+Ek$. As discussed above, by applying a second, modulated excitation source, it is possible to refine the latter analysis and resolve regions that are significantly smaller than the bare-XPS analysis spot. However, even a small spot size might be two orders of magnitude larger than a single MOSFET transistor's gate (IC front end technology has typical gate size of ~40 nm, or less), so all measurements are locally averaged, just as being done in optical CD metrology by scatterometry.

With regard to the soft breakdown detection technique of the invention, the following should be noted: Application of a too high voltage to a certain layer (e.g. $SiO_2$ or $HfO_2$ layer, or any other high K dielectric e.g. being a bottom or intermediate or a top layer in a multi-layer structure) would cause a breakdown effect across the layer. The invention is capable of detecting the breakdown condition just before the breakdown occurs (a so-called pre-BD condition). This can be implemented by applying modulated focused excitation (e.g. modulated focused optical beam) to a small region/spot of a larger area of the sample excited by one or more other excitations, thereby inducing an increase of an effective discharge efficiency across said layer and thus extract this layer contribution from the measured effective response. As a particular example, red light modulated excitation may be used for soft breakdown detection when the substrate is an intrinsic Si layer, which typically shares part of the applied potential, however due to photoconductivity under light illumination, this potential component can be drastically reduced and, thus, increase the effective voltage across said layer and thus approach locally the BD voltage of this layer. In addition, the spatial resolution (along lateral axes) may be increased due to local charge excitation within the tested insulator (e.g. a $SiO_2$ or $HfO_2$ layer) at the illuminated spot, which will locally improve charge transport across said layer in a modulated manner. Thus, the pre-BD conditions of a dielectric layer can be determined via the enhanced discharge caused by exciting illumination.

The integrity of conduction lines in electronic chips is an important aspect of quality tests. These tests are usually limited to be done at late stages of production, when electrical contacts can be approached. Therefore, early (non-contact) tests are desired. The present invention provides using the above-described technique for non-top-contact tests of the integrity of electrical conductors using side contact as well as without any side contact. In the side-contact embodiment, the test may be performed by application of modulated wide beam e-radiation (of electron flood gun) and detection of peak shifts in measured XPS spectral response (photoelectron emission spectra), or by using application of modulated focused e-radiation (e.g., e-beam pulses) and detection of electron-beam-induced current. As for the non side-contact embodiments, this can be implemented by applying excitation (e.g. focused e-radiation, preferably modulated e-beam) to a first region (e.g. small spot) on the electrical conductor being outside and distant from a second excited region of said electrical conductor and detecting the XPS response of the second region. Thus, the effect of the focused e-beam at a distal spot from that whose XPS response is being detected is small in case there is no good electrical conductivity; whereas if there is good conductivity, the conduction line responds to the imported charge promptly, even at a relatively large distance. The use of modulated focused e-beam provides for better resolving this effect. The use of an additional second modulated excitation enables improved inspection of the specific area of interest (within the larger XPS analysis area).

With regard to the test of integrity of conduction lines, it should be noted that the present invention is not limited to the combination of a broad and a focused excitation sources. It also applies for two focused beams (e.g. two e-beams directed to different spatial locations), such as to get improved spatial resolution.

As described above, the invention, in some of its aspects, provides for using multi-modulated excitations in the CREM-based technique to resolve local chemical and/or electrical properties of the sample. More specifically, this allows for resolving a specific domain/location, or property, or property at location, by using two or more modulated exciting signals. This can be advantageously used for 3D mapping of chemical and/or electric properties within a single layer, as well as in multi-layer/multi-component samples, with spatial resolution that is determined by the size of the modulated focused beam, other than the XPS X-ray source and detection setup.

As an example, in order to extract data from a certain layer in a multilayer sample (along vertical axis), the vertical location can be extracted from the effective response via identification of the response to a certain pattern of applied excitations, such as combination of phase differences and modulation frequencies, e.g., the so-called antiphase sweeps in excitations. To this end, in a specific example, the sample, while under X-ray radiation excitation, is subjected to bias voltage and wide beam e-radiation being applied in antiphase (i.e. one being gradually increased while the other being gradually decreased). This results in that each layer in the multi-layer sample responds by its characteristic XPS peak/line shift, thus enabling to stabilize a node of no variations and, thus, identify/extract the signal of a layer of interest by filtering out, in the selected electron energy window (e.g. defined by an elemental core level), the response of all layers except for the layer of interest. The chemical and electrical properties of the layer that might be of interest include composition, charge capturing, potential gradients and more. A lateral scan mode may then be used, by modulating local potential with modulated illumination or focused e-radiation to extract the lateral profile of inspected properties. Additionally, to extract specific information, the top potential at a given spot may also be fixed, e.g. by wide e-radiation or focused e-radiation, and the bias voltage be swept periodically to vary periodically the responses from all locations except for that of the top spot.

It should also be noted that, while under high energy particles excitation, e.g. by X-ray radiation (being modulated or not), applying to the sample an additional modulated excitation, by modulated illumination and/or modulated ion beam radiation and/or modulated wide beam e-radiation and/or modulated focused e-radiation, to select a laterally small spot on the sample, enables to resolve charge trapping at specific sample locations.

Thus, in some embodiments, a relatively large portion of the sample is excited by the X-ray radiation (e.g. >500 µm), having a predetermined modulation or not, and in addition, a relatively small region (e.g. <1 μm) within the X-ray irradiated sample portion is excited by focused and modulated beam(s) (including light beam(s) and/or electron beam). The combined effective response of the sample formed by electron emission from the sample, and possibly also electric current through the sample, are detected and analysed to produce measured data indicative of characteristic features of the small region within the examined sample.

The energy levels and amount of electrons emitted from the examined sample for each energy level can be measured using any known suitable electron detectors and electron energy analyzer instruments. The construction and operation of such equipment, being widely used in XPS-based system, are known per se and do not form part of the present invention and therefore need not be described in details, except to note that such systems are operable under vacuum conditions (e.g., ultra-high-vacuum) but also near ambient pressure, and may utilize retarding/focusing input electron lens assembly, a hemispherical energy analyser, and a position sensitive electron detector. The electron lens retard/focus electrons (e.g. photoelectrons) emitted from the examined sample into an entrance slit of the hemispherical energy analyzer wherein their paths are bended by application of an adjustable electromagnetic field such that electrons with a given velocity (i.e., kinetic energy) reach the position sensitive detector. The amount of electrons reaching the detector over a determined time interval is measured for different levels of field magnitudes, prior or within the energy analyser, for construction of line plots characterizing the consistency of the examined sample.

The so-produced measured data is processed and analysed in order to extract data from the response of the excited region/portion of the sample. For example, as described above, this may include extraction of data associated with the small parts of the sample surface (e.g. ~1 μm) excited by modulated focused beams in a scan mode across the relatively large region of the sample excited by the X-ray radiation (e.g. ~100 μm). This enables to significantly increase the resolution of the electron spectroscopy measurements because the measurements can be confined to those very small sample regions excited by the focused modulated beams.

In some possible embodiments, the low energy electric charge source (flood gun) is associated with a modulator and the unfocused/wide electron beam is modulated by a first periodic function (e.g., rectangular pulse wave carrier) to thereby provide a first modulated beam (also referred to herein as slow modulation beam) configured to induce spectral shifts in signals that are indicative of the top atomic layers of the sample i.e., above the specific atomic layer. Optionally, but in some embodiments preferably, the modulation frequency of a second modulated beam is substantially greater than the frequency of the first modulated beam. For example, the electron spectroscopy measurements comprise in some embodiments a slow (first) modulation electron beam of the low-energy electric charge source used to electrically charge the examined sample, and a fast (second) modulation beam e.g., of a highly concentrated photon source used to illuminate a small part of the sample region irradiated by the X-ray radiation.

In some embodiments the measured data associated with the small region (e.g. several microns) excited by the second modulated beam is extracted by subtraction within each cycle of the second (high) frequency modulation signal of the measurement data obtained while the sample is excited by the second modulated beam from the measured data obtained while the sample is not excited by the second modulated beam. The extracted measured data associated with the excited region can be then processed and analysed to determine line/peak shifts exhibited due to the first modulated (with the low frequency periodic signal) excitation to extract data characterizing the sample at various depths (e.g., 10 nm).

In some embodiments, the first modulated excitation is modulated by a periodic rectangular pulse wave configured to define within each cycle a time period in which the sample is subjected to the low energy electric charge source, and a time period in which the sample is not subjected to the low energy electric charge source (e.g., 50% duty cycle). The shifts of the characterizing XPS peaks/lines indicative of the properties of the sample at various depths can be identified by cross-correlating the measured data obtained during the time intervals in which the sample is subjected to the low energy electric charge source with the measured data obtained during time intervals in which the sample is not subjected to the low energy electric charge source. Applying this cross-correlation identification scheme to the extracted measured data associated with the small region excited by the second modulated excitation can be used to determine properties of the tested sample at the various depths within the small region excited by the second modulated excitation.

In some embodiments, the measurement setup may be utilized to conduct leakage tests of capacitive elements formed in a surface pattern of the sample (e.g., CMOS memory cells and logic FET gates), operated in a non top-contact mode. For this purpose, the sample can be electrically biased and charged (e.g. ~6 Volt) by the detached low energy electric charge source (e.g., electron flood gun—eFG). Thereafter, the sample is excited by the high-energy particles source (e.g., x-ray, or UV radiation) and the responsive emitted electron energy level and intensity are measured and analyzed to determine work function (WF) of the tested sample. The measurement is repeated at different time intervals, such as to follow the spontaneous sample's discharging. In some embodiments, for each time interval, two consecutive measurements are taken for eliminating the beam-induced (by e.g. the x-ray irradiation) discharge.

If there are electric charge leakages in capacitive elements or transistor-gate dielectric layers of the tested sample, slight changes will be observed in the work function, determined over time as the capacitive elements are discharged. These leakage test measurements can be carried out without the excitation of the sample by the modulated focused excitation (e.g. light beam).

As described above, the measurement technique disclosed herein can be used to conduct refined work function measurements. Improved identification of the work function of a sample is enabled in this technique by separately and independently conducting two different electron spectroscopy measurement modes having opposite electric charging artifacts. The two different electron spectroscopy measurement modes are performed at minimal exposure conditions, to thereby guarantee minimization of the electrical charging artifacts induced into each of the measurements. The first measurement mode consists of positive electrical charging artifacts and is termed here as the e-out mode, whereas the second measurement mode, termed here as the e-in mode, consists of negative electrical charging artifacts.

The first measurement mode is conducted in some embodiments using X-ray radiation source, with only minor dependence on the photon energy, to excite electrons in the examined sample and determine the sample's work function from the low kinetic-energy onset of emitted electrons. The second measurement mode is conducted using only the eFG source of electrons to irradiate the examined sample and determine work function from the lowest energy of electron landing on the sample's surface. The measurements obtained using the first and the second measurement modes are then analyzed and processed to determine average and difference values between the two modes.

Because the electrical charging effects of the first and second measurement modes of the work-function are of opposite directions, cancelation of the electrical charging artifacts can be achieved by computing the average value and, preferably, by restricting to minimal exposure of the sample to each of the sources, the X-ray radiation and the electron flood. The averaging of the measurement results obtained using the first and second measurement modes appreciably improves the accuracy of the obtained results, because the opposite electrical charging artifacts induced by the different excitation sources in each measurement mode (i.e., X-ray and eFG) are substantially cancelled. The computed difference between the first and second measurements can be used to evaluate the experimental error of this refined measurement procedure. In some cases, by combining in these measurements excitation of the sample by an additional, focused, modulated excitation (e.g. e-radiation and/or illumination), the refined measurement results can be confined to a small region of the sample. However, in possible applications, confining the measurements to such small regions of the sample is not required, and thus these measurements can be similarly carried out without the modulated excitation.

The measurement setup disclosed herein is used in some embodiments to conduct soft breakdown (BD) tests of dielectric elements using a non top-contact BD test mode. In these BD tests the electron emission from the examined sample may be measured under fixed conditions of the eFG, while the sample bias is gradually increased. At low bias values, the measured curves (characterizing lines) from an insulating layer are expected to show no spectral shift, due to the charging by the eFG. However, as the bias magnitude is gradually increased and hence the electrical field within the insulator is increased, a sudden emergence of breakdown is expected at at-least some domains of the sample, appearing at a sample-specific critical field magnitude and, therefore, the measured spectral line would promptly be distorted. This mechanism is herein refined to define pre-breakdown conditions, in which spectral distortions under elevated fields are enhanced by a second, potentially modulated, input signal, thus suppressing the related sample damage. These BD test measurements can be carried out with, or without the excitation (e.g. illumination) of the sample by the focused high-frequency modulated excitation. If the sample is excited by the focused excitation, the BD test measurements can be confined to a small region of the sample, as described hereinabove and hereinbelow.

Optionally, but in some embodiments preferably, the electron detector used in the measurement setup comprises an array/matrix of sensor elements arranged along the output slit of an energy analyzer. By using the array/matrix of sensor elements in the detector, the electromagnetic field applied in the (e.g. hemispherical) energy analyzer can be maintained at a constant level throughout the measurements and the amount of electrons associated with each energy level of the emitted electrons can be measured by respective ones of the sensor elements according to their relative location in the array. This way, the measurement setup can be used to concurrently measure electrons of different energy levels without requiring the repetitious energy level scan process carried out by changing the electromagnetic field applied by the energy analyzer. Namely, the measurements can be substantially accelerated to improve the measurement speed (by at least two orders of magnitude) because a range of energy levels of the emitted electrons can be measured at once. A CCD-like sensor (charge coupled device) can be used for this purpose to simultaneously measure the amount of electrons in the different energy levels (i.e., electrons propagating along different trajectories in the energy analyzer and thus detected by different "pixels" in the matrix of sensor elements).

In some further aspects, the invention provides a method for measuring a work function of a sample comprising:

performing at least one measurement session on the sample to determine a work function of the sample, the measurement session comprising first and second measurement modes sequentially performed on the sample, wherein:

the first measurement mode comprises exciting the sample by high energy electromagnetic radiation (e.g. X-ray radiation, or UV radiation) and concurrently monitoring a secondary electron emission (SEE) spectral response of the sample to said X-ray radiation or UV radiation to detect a low kinetic energy onset of the spectral response being indicative of a first measure of a work function of the sample, and the second measurement mode comprises supplying initial bias voltage to the sample and replacing the excitation of electromagnetic radiation by exposure to e-radiation of a relatively low energy electron flux, followed by a gradual variation of the applied sample bias voltage from said initial bias voltage, and monitoring an electric current through the sample, to thereby detect a turning point (TP) in the sample-current readout, corresponding to an effect of electrons being landing on the surface of the sample and being indicative of a second measure of a work function of the sample;

analyzing the first and second measures of the work function and determining an effective work function of the sample.

The determination of the effective work function from the first and second measures may include determination of an average value and, also, may include evaluation of the magnitude of an error associated with beam-induced artefacts.

In some embodiments, two or more measurement sessions can be sequentially performed, resulting in alternatingly performed first and second measurement modes. This enables to determine charge trapping efficiencies of the sample. Hence, approximate evaluation of electron and hole trap densities can be performed.

In some embodiments, the work function measurements are used in order to detect electric charge leakages in capacitive elements in a sample, being identified via changes in the work function, as determined over time upon discharge out of the capacitive elements. It should be understood that the charge leakage detection may be implemented by repetitive performance of only one of the first and second measurement modes.

BRIEF DESCRIPTION OF THE DRAWINGS

In order to understand the invention and to see how it may be carried out in practice, embodiments will now be described, by way of non-limiting example only, with reference to the accompanying drawings. Features shown in the drawings are meant to be illustrative of only some embodiments of the invention, unless otherwise implicitly indicated. In the drawings like reference numerals are used to indicate corresponding parts, and in which:

FIG. 2 schematically illustrates, by way of a block diagram, an electron spectroscopy measurement system according to some possible embodiments of the present invention;

FIG. 3A to FIG. 3E show more specifically some examples of the configuration and operation of the measurement system of FIG. 2, wherein FIG. 3A is a block diagram of one example of the possible implementation of the measurement system, FIG. 3B exemplifies spatial distribution of the applied excitations, and FIG. 3C is a block diagram of another possible implementation of the measurement system; FIG. 3D exemplifies the operation of two modulated sources, the eFG and the sample bias in an anti-phase manner, to selectively probe XPS signals from a specific height (z-value) and enable vertical resolution in the compositional analysis; FIG. 3E illustrates an optional test mode of the integrity of conduction lines, where a modulated focused e-beam scans across an area that does not intersect with the area probed by the XPS detection setup.

FIG. 4A shows a flow diagram 30 of this process, FIGS. 4B and 4C show the work function measure plots, and FIG. 4D exemplifies the leakage measurement.

FIGS. 6A and 6B schematically illustrate a breakdown test according to some possible embodiments, wherein FIG. 6A is a block diagram of measurement setup and FIG. 6B shows characterizing lines obtained in an experiment carried out therewith, where $CL_1$ and $CL_2$ indicate standard conditions in an insulating layer and $CL_3$ exemplifies the soft breakdown state of P1, just below its breakdown point;

FIGS. 7A to 7C schematically illustrate use of an array/matrix of sensor elements in the detector to accelerate the measurement process, wherein FIG. 7A is a block diagram exemplifying use of an array/matrix of sensor elements in the measurement setup, FIG. 7B shows line plots of measurement results obtained utilizing the conventional energy scan by electron spectroscopy detection setup, and FIG. 7C shows the measurement results obtained utilizing the accelerated measurement process employing an array/matrix of sensor elements.

DETAILED DESCRIPTION OF EMBODIMENTS

Figure 1A:
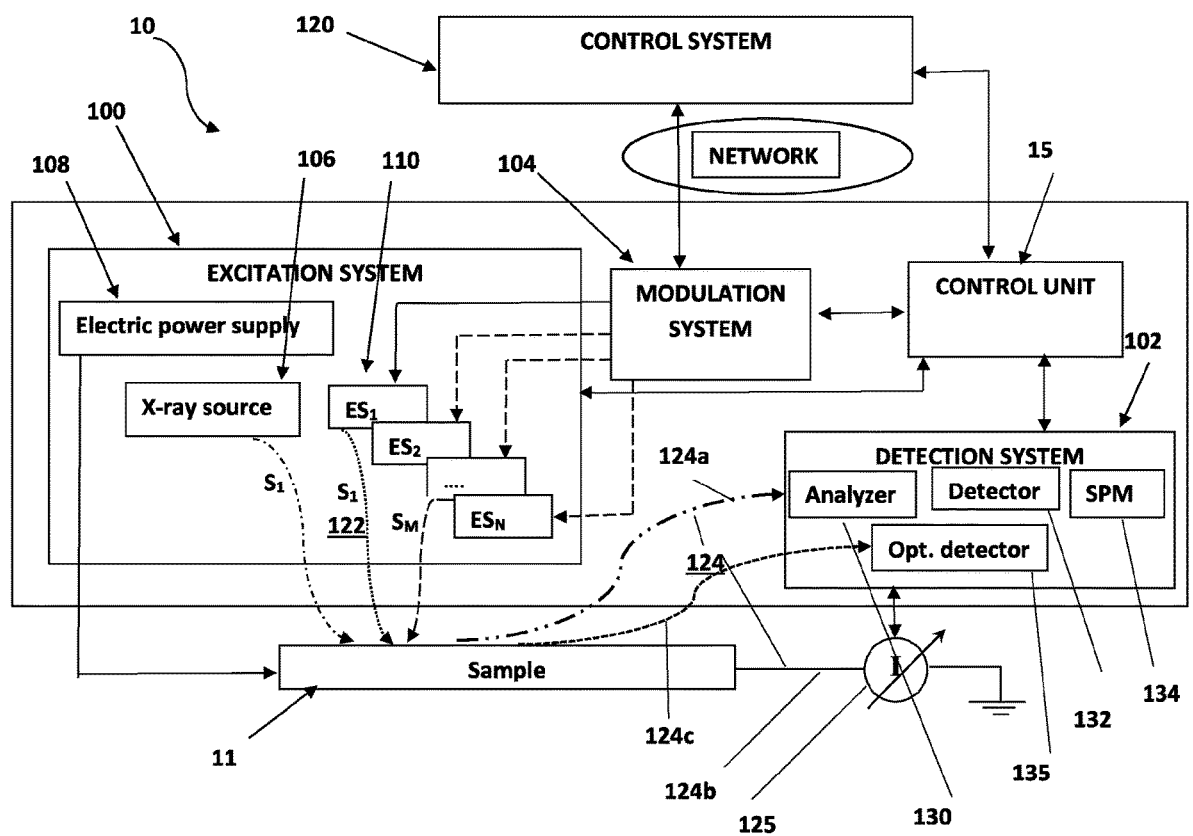
FIG. 1A is a block diagram of an X-ray based measurement system configured and operable according to the principles of the invention.

Some specific embodiments of the present disclosure will be described below with reference to the drawings, which are to be considered in all aspects as illustrative only and not restrictive in any manner. In an effort to provide a concise description of these embodiments, not all features of an actual implementation are described in the specification. Elements illustrated in the drawings are not necessarily to scale, or in correct proportional relationships, which are not critical. Emphasis instead is being placed upon clearly illustrating the principles of the invention such that persons skilled in the art will be able to make and use electron spectroscopy measurement techniques of this disclosure, once they understand the principles of the subject matter disclosed herein. This invention may be provided in other specific forms and embodiments without departing from the essential characteristics described herein.

The present application provides electron spectroscopy measurement techniques adapted to refine and improve resolution of the electron spectroscopy measurements, as well as the range of properties of nano-structures formed in a surface of an examined sample that can be performed by the electron spectroscopy setup.

Referring to FIG. 1A, there is illustrated, by way of a block diagram, a measurement system 10 according to some embodiments of the invention for performing electron spectroscopy measurements on a sample 11. The measurement system 10 includes an excitation system 100 and a detection system 102, and also in some aspects of the invention includes a modulation system 104. The measurement system also includes a control unit 15 which controls operation of the excitation, and detection systems, and modulation system (if used) and may also be configured for processing output data of the detection system. The control unit 15 may be connectable (via wires or wireless signal connection) to a control system 120, which may be integral with the measurement system or may be a part of a remote central system connectable to the measurement system 10 via a communication network, as the case may be. To this end, the measurement system 10 may be equipped with an appropriate communication utility (not specifically shown).

The excitation system 100 is configured and operable to generate excitation 122 formed by multiple exciting signals—m such signals $S_1 \ldots S_M$ being exemplified in the figure, being of different types, which are concurrently applied to a portion of the sample to cause a combined effective response 124 of the sample to such multi-signal excitation which is detected by the detection system 102.

As described above, the effective response 124 of the sample may include a direct response 124a constituted by electron emission from the sample and/or a response 124b constituted by a measurable change of an electric parameter of the sample, e.g. current through the sample measured by respective device/circuit 125. Also, in some embodiments, the effective response may include an optical response 124c.

In the embodiments according to some aspects of the invention utilizing modulated excitation(s), the excitation system 100 is controllably operable by the modulation system 104, such that at least one of the exciting signals is modulated in a predetermined manner. As also described above, the different excitation signals are of different types and thus differently affect the sample, enabling extraction of information about a specific location and/or property of the sample.

Thus, the excitation system 100 includes: an X-ray source 106 (constituting a high-energy radiation source (of e.g. 1.5 keV, but very different source energies can be selected) configured to irradiate the examined sample to cause emission of electrons from the sample; a power supply unit (e.g. voltage source) 108 configured and operable as an electric charge source to electrically charge (biasing) the examined sample 11 to a desired voltage level, being either of a fixed value or in the form of a predetermined function of the time modulation of the voltage supply; and also includes one or more additional excitation sources, designated generally as 110. In the present not limiting example of FIG. 1A, n such excitation sources $ES_1$, $ES_2$, ... $ES_N$ are shown. Such additional excitation sources include one or more of the following: an ion beam source for generating ion beam(s) of relatively low energy; a flood gun generating e-radiation in the form of a "wide" electron beam; an electron source generating e-radiation in the form of a focused electron beam; a light source system generating illumination in the form of one or more light beams (e.g. laser beams).

As described above, according to some aspects of the invention, at least one of the exciting signals generated by the excitation system is modulated in a predetermined manner. As will be described further below, in some embodiments of the invention, at least two exciting signals are modulated, each in a predetermined manner.

It should be understood that the X-ray source 106, can be replaced by an electron beam, being a high-energy particle source, configured to irradiate the examined sample and cause emission of electrons from the sample. In the examples described herein below, the high-energy particle source is constituted by an X-ray source, but it should be understood that the invention is not limited to such configuration, and the high-energy particles may also relate to e.g. electrons in an electron beam.

It should be understood that different excitation sources affect sample regions of different sizes. The e-radiation by the flood gun (wide e-beam) typically excites a region $R_1$ larger than a region $R_2$ excitable by the x-ray source, which is by itself larger than a region $R_3$ excitable by the focused electron beam or laser beam. For example, considering the use of a modulated light beam, it can be tuned to illuminate a small part (of e.g. a micrometer or sub-µm size) of the sample located within, or at least partially intersecting with, the larger portion/region of the sample being irradiated by the X-ray beam. The modulated excitation (e.g. illumination) of a spot (relatively small part) of the sample while under X-ray excitation (modulated or not) and wide e-beam radiation (e.g. modulated) affects the emission of photoelectrons from the small part of the examined sample. Hence, the excitation system of the invention provides for exciting a relatively large region of the sample (e.g. while under a certain charged condition/state), and scan the so-excited large region by local excitation(s) using the focused electron beam and/or laser beam(s), where two or more of these "global" and/or "local" excitations have predetermined modulations. This produces a combined effective response of the sample which is "marked" by said predetermined modulations, enabling demodulation/decoding of data corresponding to the detected signal. For example, the timing of readout circuit of the electron detector may be controlled by a trigger signal, such as to strictly retain temporal correlation with the modulated excitation source(s).

The e-radiation (unfocused or focused) may have one or more of the following modulations: current modulation and/or varied kinetic energy (i.e. landing energy), modulated in any chosen frequency. Modulation of illumination may be implemented by wavelength, polarization and/or amplitude variation, as well as a temporal frequency modulation. Two or more light beams may be used differing from one another in at least one of these parameters.

The detection system 102 is configured to detect electron emission response of the sample to the excitations, and possibly also a change in the electric current of the sample in response to the excitations, and in some embodiments to also detect optical response of the sample to one or more of the excitations. Electron emission 124a of the examined sample in response to the applied excitations 122 is received in the detection system 102, which includes an electron energy analyzer unit 130 configured to direct electrons within a specific range of energy levels to an electron detection device 132 configured to measure the amount of electrons reaching the detector. The energy analyzer unit 130 is configured to resolve electrons of different energies, e.g. by applying an electromagnetic field for bending the paths of the electrons emitted from the examined sample with a certain kinetic energy level, to thereby direct them to the electron detector device 132. Also provided in the detection system 102 is a sample's parameter detector (SPD) 134 associated with the measurement circuit 125.

The measured data, including data generated by the electron detector device 132, and possibly also data about electric parameter of the sample generated by detector 134, corresponding to detected combined effective response of the sample to multiple modulated excitations, is processed by the control unit 15 to generate quantifying data associated with the amount of electrons emitted from the examined sample with the certain kinetic energy level. This process is typically repeated numerous times using different electromagnetic field strengths in the energy analyzer unit 130 until all of the relevant energy levels of the electrons are scanned. The quantifying data generated for the different energy levels is processed to generate a characteristic line plot indicative of the amount of emitted electrons at the different energy level measurements. Data indicative of the characteristic line plot can be stored in a memory of the measurement system, and may be communicated to the control system 120.

As also shown in FIG. 1A, the detection system 102 may also include an optical spectrometer 135 for detecting optical response 124c (reflection/scattering) of the sample to illumination (e.g. modulated focused optical beam(s)) as a function of wavelength. As described above, the optical detector 135 may include optical response of the sample (e.g. luminescence) to any of the non-optical excitation(s). Optical measurement may be applied as part of the electric measurement (i.e. concurrently with excitation of the sample by the above described two or more excitations) or in separate measurement sessions.

For example, the above-described modulated CREM-based measurements may be combined with optical type measurements on a sample, e.g. as part of automatic inspection of samples progressing on a production line. This may for example be used for preliminary automatic "electric" inspection applied concurrently with automatic optical inspection to reduce the number of "potentially defective" samples resulting from pure optical inspection, as well as can be used for performing preliminary verification of the sample's status for samples classified as "potentially defective" by pure optical measurements. By using appropriate machine learning with regard to XPS-based effective radiation responses of specific samples and their optical responses, a correlation (matching condition) between such responses of different types can be predetermined and used in combined automatic inspection, enabling to detect samples characterized by a mismatch in these responses to be classified as potentially defective.

In some examples, the measurement session is performed using the X-ray excitation of a relatively large region $R_2$ of the sample, e.g. a spot of ~500 µm, being a part of even larger region $R_1$ (e.g. ~3 mm in diameter) excited by relatively slow modulation of the "wide" electron beam, together with a relatively fast modulation of the optical beam to illuminate the small part $R_3$ (e.g. ≤1 μm in diameter) of region $R_1$. The illumination of the sample by the fast modulated photon source permits extraction from the measurements signals/data information about the illuminated small portion of the sample. The slow modulation of the electric charging source causes shifts in the produced characteristic lines, said shifts correlating with atomic position in depth direction of the examined sample, and thus permits 3D mapping of the electrical/chemical properties of the sample, exploiting spatial resolution by the thus selected small portions of the sample illuminated by the photon source.

Figure 1B:
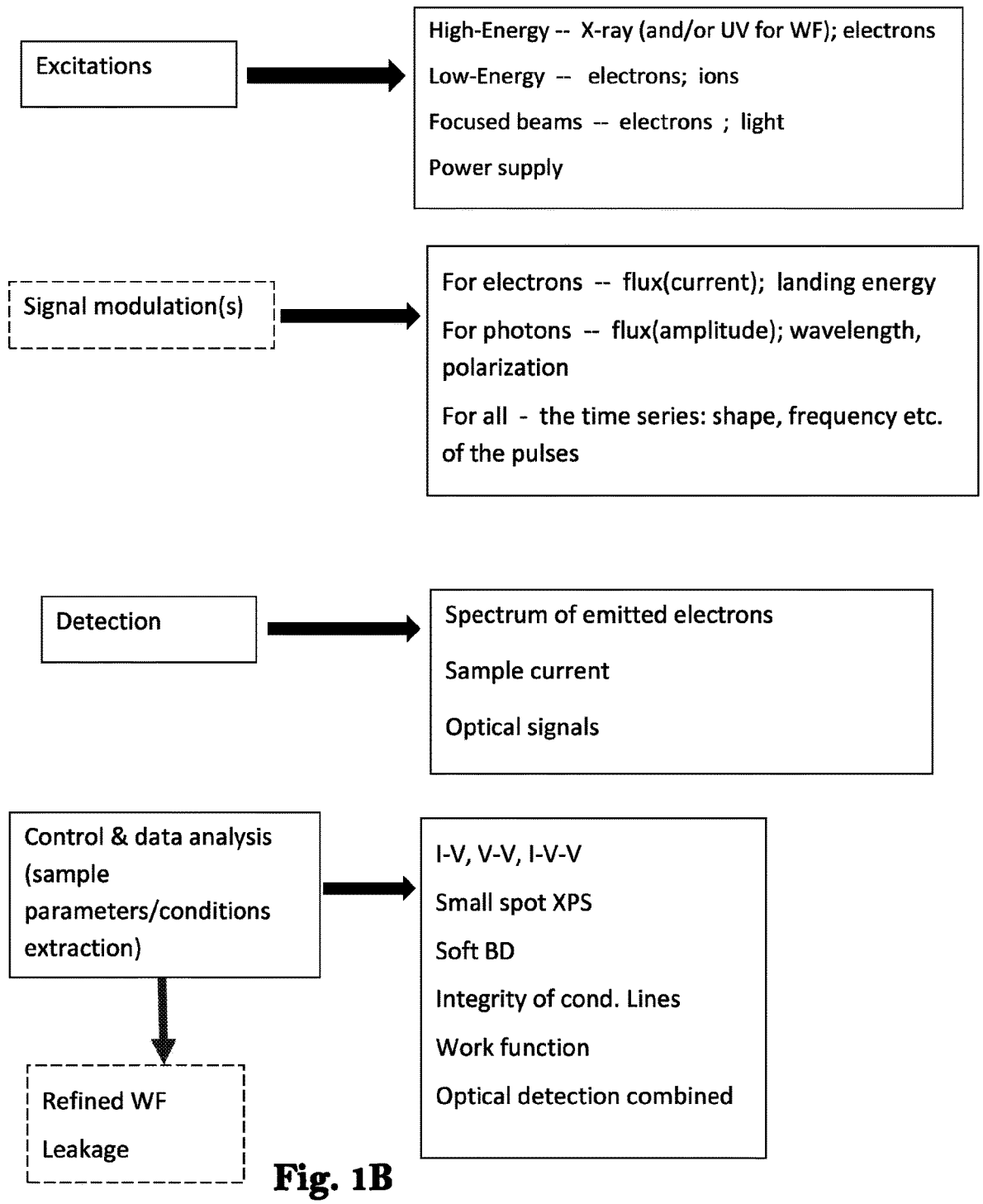
FIG. 1B is a block diagram summarizing some examples of the operation of the measurement system of the invention for determination of various parameters/conditions of a sample being measured.

FIG. 1B summarizes, by way of a self-explanatory block diagram, the above-described operation of the measurement system of the invention for determination of various parameters/conditions of a sample being measured, which will be more specifically described further below.

As shown in the figure, the system of the present invention is configured to perform excitation of a sample by multiple excitations of different types. According to some embodiments for determination of some parameters/properties (e.g. work function, leakage), modulation of any of the exciting signals may not be used (and therefore the modulation step is shown by dashed-line block). According to some other embodiments of the invention, at least one of the excitations is controllably modulated (e.g. for detection of conduction integrity of leads and/or refined WF and/or combined optical detection and CREM); and for alternative or additional determinant of one or more of other parameters (I-V and V-V characteristics and/or small spot XPS and/or soft BD) at least two of the excitations is/are controllably modulated. The effective response of the sample to said excitations is detected; and analysis of the detected effective response provides to determine one or more of various parameters/conditions of the sample (at least a portion/spot of the sample).

The excitations include two or more of the following: high energy excitation(s) (X-ray and/or electrons; and in some embodiments may include UV radiation for the work function (WF) determination); low-energy excitation(s) (electrons and/or ions); small-spot (e.g. focused) excitations (electrons and/or light); and power supply (e.g. sample biasing). The signal modulations may include: flux (current) and/or landing energy for charged particles' (e.g. electrons') excitation modulation; flux (amplitude) and/or wavelength and/or polarization for photon-type excitation modulation; as well as shape and/or frequency modulation for any of the excitations being used.

The detected effective response, obtained using the above-described two or more modulated excitations, includes spectrum of emitted electrons and/or sample current and/or optical signals. The sample's parameters/conditions extracted from data indicative of the detected effective response of the sample to the excitations include one or more of the following: I-V, V-V, I-V-V characteristics of the sample; small spot XPS data; soft breakdown (BD) tests; integrity of electrical conductors/leads in a surface pattern of the sample; work function (WF); as well as optical parameters in combination with any of the above-listed electrical characteristics.

The electron spectroscopy measurement setup disclosed herein can be used to collect high resolution data indicative of the consistency of the examined sample, and for carrying out various tests of nanostructures formed in the specific atomic layers of the examined sample with substantially improved accuracy and resolution. For example, the technique of the invention provides for determining electrical properties of patterned or non-patterned wafers of logic and memory Integrated Circuits (IC); such electrical properties include CMOS MOSFET gates I-V and capacitance with high-K insulating layers, on top of semiconducting layers.

As described hereinabove and hereinbelow in details, the electron spectroscopy measurement setups disclosed herein can be used, inter alia, for extracting refined work function (WF); conducting leakage tests of capacitive elements (e.g., memory cells, FET's gate high-k dielectric layers) formed in the specific atomic layers of the examined sample, and/or for carrying out refined work function measurements, and/or for implementing non top-contact soft breakdown tests of dielectric elements formed in the specific atomic layers of the examined sample and/or for non top-contact integrity tests of electrical leads formed therein, and/or for providing I-V characteristics and/or V-V characteristics of dielectric elements formed in specific domains of the examined sample.

As also described hereinabove and hereinbelow in details, the measurement setups disclosed herein can be adapted for significantly accelerating the measurement process by using in the electron detector an array/matrix of sensor elements, each of which configured to generate data/signals indicative of the amount of photoelectrons emitted from the examined sample with a certain kinetic energy level according to the relative location of the sensor within the array/matrix. In this way, characterizing lines of the examined sample can be produced by a single measurement session without subsequent variation of the electromagnetic fields applied in the electron analyzer unit i.e., avoiding time consuming energy scan stages.

For an overview of several example features, process stages, and principles of this disclosure, the examples illustrated schematically and diagrammatically in the figures are intended for electron spectroscopy applications. These measurement setups are shown as one example implementation that demonstrates a number of features, processes, and principles used to provide characterizing information of specific atomic layers of a sample, but they are also useful for other applications and can be made in different variations. Therefore, this description will proceed with reference to the shown examples, but with the understanding that the invention recited in the claims below can also be implemented in myriad other ways, once the principles are understood from the descriptions, explanations, and drawings herein. All such variations, as well as any other modifications apparent to one of ordinary skill in the art and useful in electron spectroscopy applications may be suitably employed, and are intended to fall within the scope of this disclosure.

Figures 2, 3A:
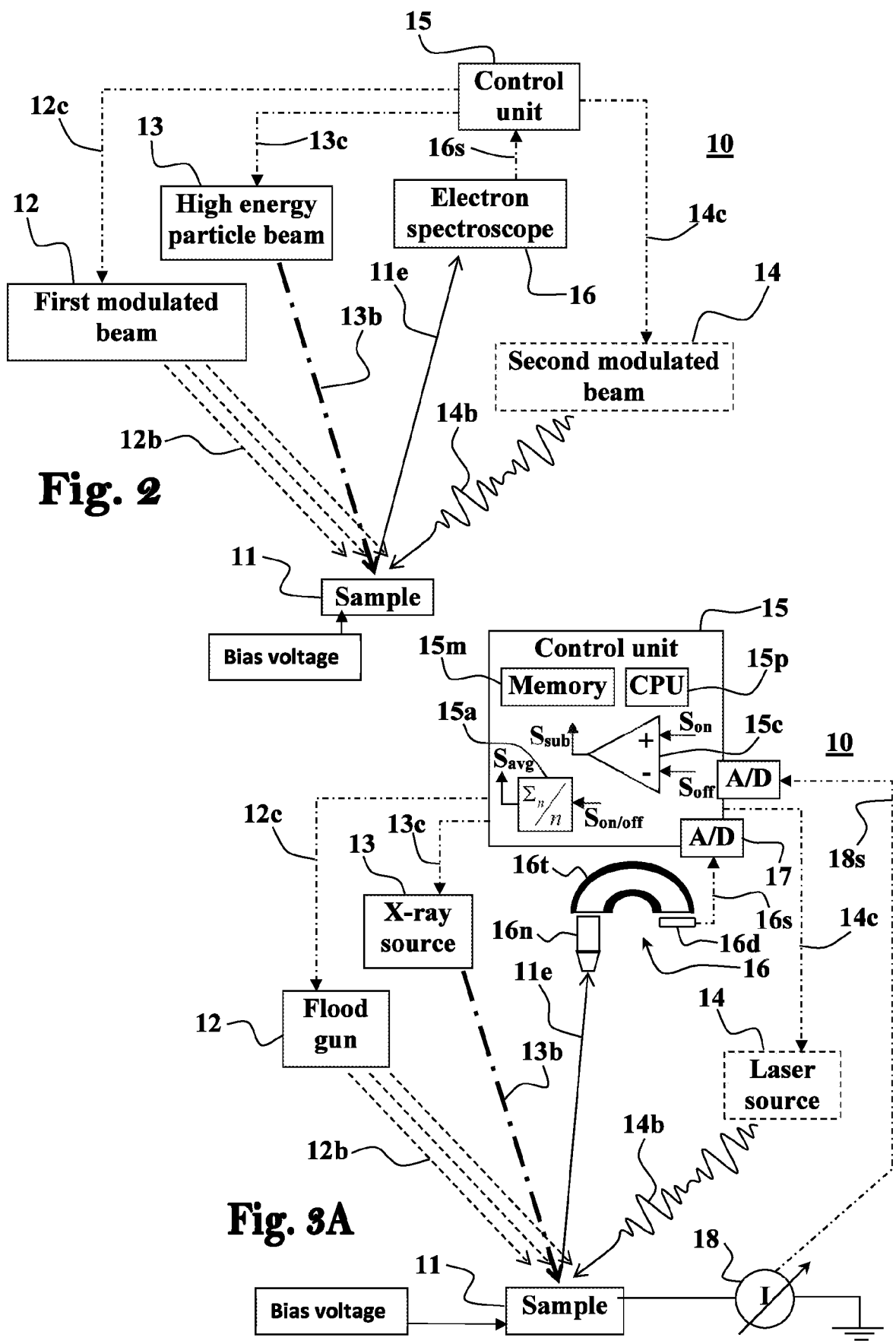

FIG. 2 schematically illustrates an example of the operation of the electron spectroscopy measurement system 10 of the invention usable for determining consistency of, and/or for non top-contact testing of nanostructures formed in, an examined sample 11. In this specific not limiting example, the excitation system includes radiation sources including: an X-ray source 13 producing X-ray radiation 13b (high energy, e.g. 1.5 keV beam) that irradiates a portion/region of the upper surface of the sample 11 and excites electrons in atomic structures therein, a flood gun 12 (low energy electrically charged particle source) which may be associated with its modulator (not shown here) to produce a modulated electron beam 12b for electrically charging at least a portion of the sample within a region covering the X-ray radiation excited region, and a light source 14 which may be associated with its modulator (not shown here) producing a modulated focused light beam 14b configured to illuminate a (possibly small) part of the upper surface region of the sample contained in (or intersecting with) said portion of the sample 11 radiated by the X-ray radiation 13b. An electron spectroscope 16 (analyzer 130 in FIG. 1A) receives electrons 11e emitted from the examined sample 11 and direct data indicative thereof to an electron detector device (132 in FIG. 1A) to generate corresponding measured data/signals 16s indicative of quantity of photoelectrons emitted from the examined sample 11 with various different kinetic energy levels.

The control unit 15 operates to orchestrate the operation of the different units/devices of the system 10. Particularly, the control unit 15 can be configured to generate control signals/data 12c for operating the electron beam source 12 (flood gun) with its respective modulator, control signals/data 13c for operating the X-ray source 13, and control signals/data 14c for operating the light source 14 with its respective modulator. The control signals 13c and 14c can be used to adjust the parts of the sample 11 that are radiated by the X-ray radiation 13b and the location of the small part of the sample excited by the modulated excitation (e.g. focused photon beam) 14b, for examining different regions of the sample 11, or to thereby scan the entire upper surface of the sample.

The control unit 15 can be configured to receive and process data/signals 16s generated by the detection system (102 in FIG. 1A) for generating characteristic spectral lines indicative of chemical elements/molecules in the specific atomic layers of the examined sample 11, and/or for determining work functions thereof, and/or for generating test data indicative of integrity of nano structures formed therein, and/or for constructing I-V characteristics and/or V-V or I-V-V characteristics of the examined sample.

The focused photon beam 14b generated by the light source 14 can modulate a high frequency periodic carrier signal. Optionally, but in some embodiments preferably, the high frequency periodic carrier signal is a rectangular-shaped periodic signal having a determined duty cycle configured to define within each illumination cycle an illumination time interval in which the small portion of the examined sample 11 is illuminated by the focused photon beam 14b, and a non-illuminated time interval in which it is not thereby illuminated.

The control unit 15 may be configured to demodulate the measured data/signals 16s generated by the electron spectroscope system 16 with the high frequency periodic carrier signal of the modulated focused photon source 14 in order to extract from the data/signals 16s illumination related information indicative of the small region of sample illuminated by the photon source 14. Optionally, but in some embodiments preferably, the illumination related information is extracted from the measurement data/signals 16s obtained in each illumination cycle by subtracting the portion of the data/signals 16s measured during non-illumination time interval of the cycle ($S_{off}$ in FIG. 3A) from the data/signals 16s measured during the illumination time interval of the cycle ($S_{on}$ in FIG. 3A).

Optionally, but in some embodiments preferably, the charged particles 12b produced by the low energy electrically charged particle source 12 modulates the output of this source to yield a low frequency carrier signals. The modulation of the charging conditions of the sample causes shifts in the produced characteristic lines, which correlates with atomic position, e.g. in depth direction, and thus provides information about electrons emitted from this one, as well as other atomic layers of the sample (up to 20 nm).

FIG. 3A schematically illustrates a non-limiting example of a possible configuration of the electron spectroscopy measurement system 10 of the invention. In this example, the excitation system includes an electron flood gun (eFG) 12 for flooding the upper surface of the examined sample 11 with the modulated electron beams 12b, an X-ray source 13 for irradiating a portion of the examined sample with X-ray beams 13b, and a light source 14 for illuminating a small region of the sample by focused modulated beams of photons 14b. The electron spectroscope 16 in this example comprises a retarding/focusing input electron lens assembly 16n configured to receive and focus/retard photoelectrons 11e emitted from the sample 11, a concentric hemispherical analyser assembly 16t configured to receive the focused/retarded electrons 11e from the electron lens assembly 16n and bend their paths by application of electromagnetic fields for directing them onto the electron detector device 16d.

The control unit 15 comprises one or more processors 15p and memories 15m configured and operable to execute software instructions programmed to generate the control signals/data 12c, 13c and 14c, and to process the data/signals 16s generated by the electron detector device 16d. An analog-to-digital (A/D) converter 17 may be provided inside, or external to, the control unit 15 to digitize signals 16s generated by the electron detector device 16d.

A subtraction module 15c may be provided inside, or external to, the control unit for subtracting the data/signals measured during the illumination ($S_{on}$) and the non-illumination ($S_{off}$) time intervals of each illumination cycle and generating a subtraction signal/data $S_{sub}$ indicative thereof. If the subtraction module 15c is implemented as an external unit an additional analog-to-digital converter (not shown) may be used for digitizing the subtracted signal $S_{sub}$ thereby produced. An averaging module 15a may be also provided inside, or external to, the control unit 15 for computing a mean value $S_{avg}$ of the data/signals 16s measured during the illumination and the non-illumination time intervals of the illumination cycle. If the averaging module 15a is implemented as an external unit a yet additional analog-to-digital converter (not shown) may be used for digitizing the calculated mean value $S_{avg}$ thereby produced.

In some possible embodiments an ammeter 18 is used to measure electric current through the examined sample 11. This may be used to measure the effect of X-ray radiation on the sample, as well as any other input signal, and thus present a part of the effective response of the sample to the excitation. Alternatively or additionally, the electric current measurements may be used in other modes of operation, including the work function measurements. An additional analog-to-digital (A/D) converter may be provided inside, or external to, the control unit 15 to digitize signals 18s generated by the ammeter device 18.

Figure 3B:
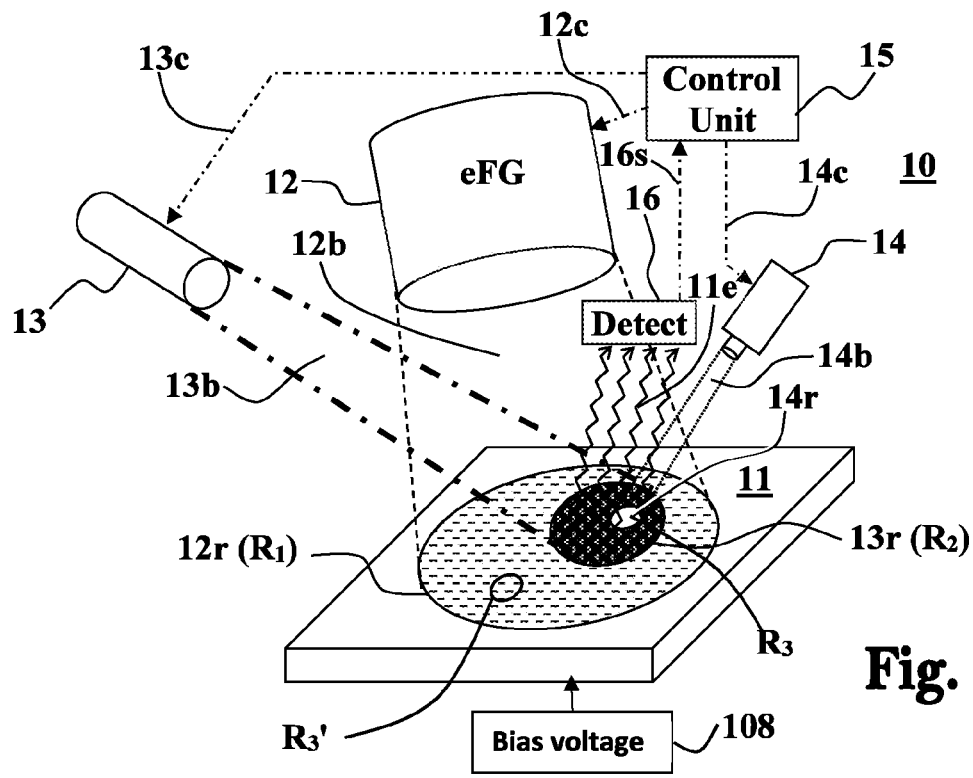

FIG. 3B exemplifies spatial distributions of the different beams applied to the upper surface of the examined sample 11 in possible embodiments by the electron spectroscopy system 10. In this specific and non-limiting example the eFG 12 generates a wide electron flood beam 12b covering a substantial area 12r (relatively large region $R_1$) of the examined sample 11. The X-ray beam 13b from the X-ray source 13 covers a somewhat smaller area 13r (region $R_2$) of the examined sample 11 contained inside the area 12r (inside region $R_1$), or substantially intersecting the area 12r flooded by the electron beam 12b. The laser beam 14r is configured to illuminate a significantly smaller region $R_3$/spot 14r of the examined sample contained inside, or substantially intersecting the area 13r irradiated by the X-ray beam 13b.

As also shown in FIG. 3B, the X-radiation and possibly also focused illumination may be used for exciting relatively small spots $R_3$ and $R_3'$ being distant from one another. As will be described further below, this can be used for e.g. measuring integrity of electrical conduction lines/leads.

Figure 3C:
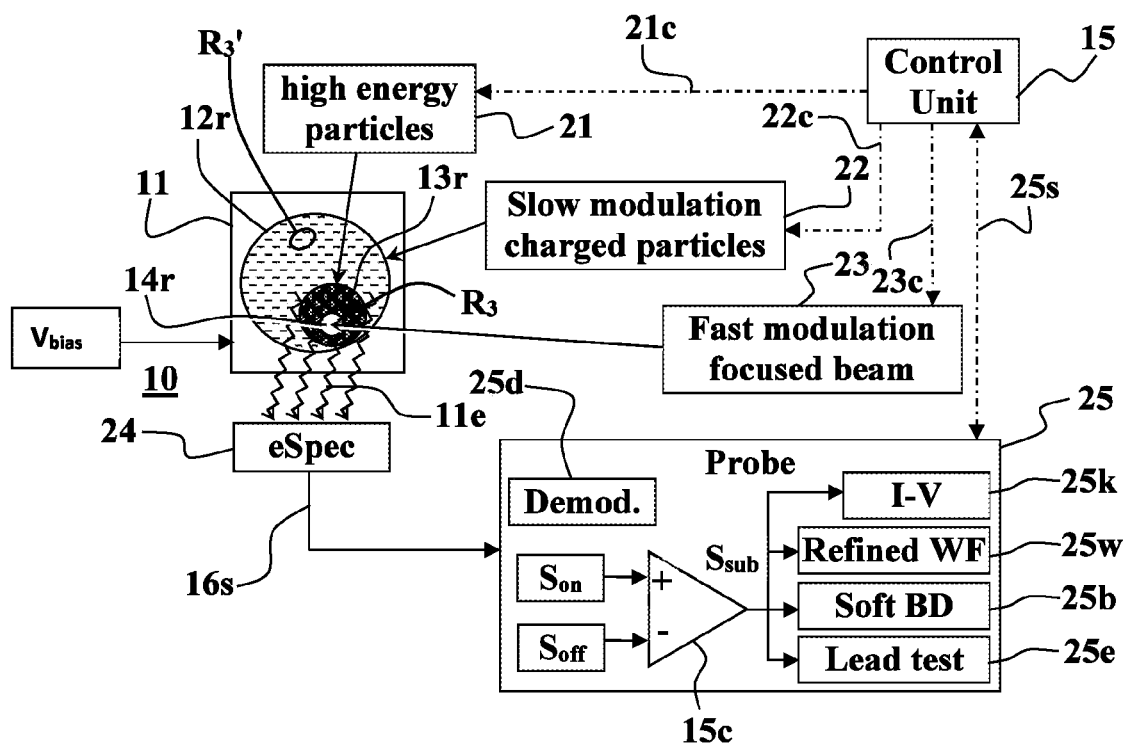

FIG. 3C demonstrates use of a probe unit 25 in the electron spectroscopy system for carrying out various measurements and/or tests of the examined sample 11. The system 10 includes a slow modulation electrical charge source (e.g., eFG) 22, a high energy particles source (e.g., X-ray) 21, a fast modulation photon source (e.g., laser) 23, and a detection system 24 configured to detect electrons 11e emitted from the examined sample 11. A control unit 15 can be used to operate the various components of the system by respective control signals 22c, 21c and 23c. The various components of the electron spectroscopy system 10 can be implemented by the same units described hereinabove or hereinbelow for electrically charging the examined sample, excitation of electrons in the sample, and for optically illuminating the sample.

The probe unit 25 is shown in this FIG. 3C as an external independent unit, but in some embodiments it may be partially, or fully, embedded in the control unit 15.

The data/signals 16s generated by the detection system 24 are processed by the probe unit 25 which may be configured to communicate data/signals 25s with the control unit 15. The probe unit 25 can have a demodulation unit 25d configured to demodulate the signal 16s and extract therefrom information associated with the portions of the sample 14r that are illuminated by the modulated photon beam. Optionally, but in some embodiments preferably, the probe unit 25 comprises a subtraction unit configured to extract the information associated with the illuminated portions of the sample 14r by subtracting the signals 16s measured by the detector 24 during non-illumination time intervals from the signals 16s measured by the detector 24 during illumination time intervals.

The control unit 15 can be configured to determine the frequency used for the fast modulation of the focused source 23, produce control signal 23c for operating the focused source 23 to produce the desired fast modulation excitation (e.g. photon beam or e-beam), and provide the probe unit 25 corresponding signals/data 25s to indicate the time interval that the sample is being illuminated by the focused source 23. One or more processors and memories can be used in the probe unit 25 to store signals/data 16s generated by the detection system 24, associate each stored signals/data 16s with illumination or with non-illumination time intervals, and generate the subtracted signal $S_{sub}$ by subtraction 15c of measured signals/data 16s during the illumination and non-illumination time intervals.

The probe unit 25 can be configured to process the signals/data 16s from the detection system 24 for determining various properties of the examined sample 11 and/or of micro/nano-structures formed in its specific atomic layers. For this purpose the probe unit 25 comprises a processor unit for extracting I-V and/or V-V characteristics, unit 25k, a refined work function determination unit 25w, a soft breakdown test unit 25b, and a lead integrity test unit 25e. It is noted that these units 25k (providing I-V but also V-V outputs), 25w, 25b and 25e, can be configured to directly use the signals/data 16s generated by the detector 24 i.e., without the demodulation 25d and/or the subtraction 15c. In FIG. 3C, however, the units 25k, 25w, 25b and 25e, of the probe 25 receive the subtracted signal $S_{sub}$ from the subtractor 15c in order to confine the processing thereby conducted to the small portions of the examined sample 11 illuminated by the fast modulation focused source 23.

As described above, the technique of the invention utilizing multi-modulated excitations provides for measuring any of the above mentioned electrical properties of a sample, as well as material-related properties of the sample with high spatial resolution, across the sample and through the sample.

The soft breakdown detection applies for e.g. an effect occurring when a too high voltage is applied to a certain layer (e.g. $HfO_2$ with or without $SiO_2$ layer, e.g. being a layer within a multi-layer structure), and the breakdown effect occurs vertically across the layer. By using the above-described multi-modulated excitation with the modulated optical beam being focused on a small spot of the sample, while under larger area excitation of the sample with X-ray and possibly also an e-beam (preferably modulated excitation(s)) thereby inducing modification (e.g. increase) of an effective voltage difference across said layer (e.g. via enhanced discharge, depending on the layer conductivity). This results in a layer-characteristic shift of the XPS line in the detected response. This enables evaluation of the pre-breakdown conditions, just before the standard breakdown (namely breakdown at dark) occurs.

In some embodiments, in order to extract data from a certain layer in the sample (along vertical axis), the vertical location (z-location) can be extracted from the effective response obtained using the technique of the invention. In many devices there are layers at different heights that are (intentionally, should be) chemically identical. Unfolding the compositional analysis into layer-specific analysis is usually very difficult, because the XPS lines from all identical layers would naturally overlap. By applying potential gradients across the structure, there will be different line shifts for different layers and, thus, an option to resolve them one by one is in principle possible. Also, if one wants to identify the z-distribution of a given element within a layer, an impurity for example, it may become very difficult to get it by standard XPS techniques. The technique of the invention enables such detection, for example via identification of the effective response to so-called antiphase sweeps in excitations.

Figure 3D:
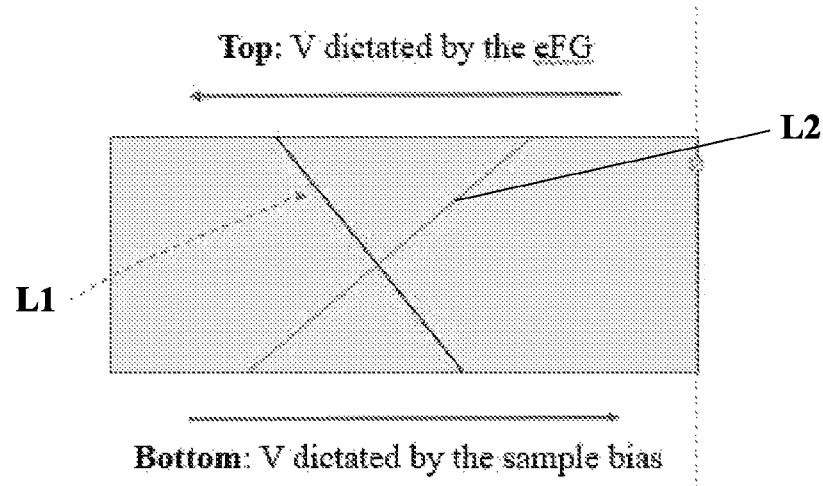

In this connection, reference is made to FIG. 3D. When for example the exciting broad electron beam e-radiation is set to a given state, a potential gradient is induced across non-metallic layers, e.g. an oxide layer, as shown by line L1. By modulating the parameters of the flood gun, the slope of that voltage function V(z) is varied periodically. In addition, by modulating the bias voltage applied to the sample, the sample potential can be varied as well, as shown by line L2. Under a specific combination of the modulated focused e-radiation and the sample bias, large potential variations can be dictated everywhere, except for a specific height, as illustrated by the cross between lines L1 and L2, where the amplitude of line shifts is practically zero. Then, XPS spectral lines from all heights can be wiped out by enormous broadening, except for a small region around the height of interest, at which there is a constant potential.

Thus, by subjecting the sample, while under X-ray radiation excitation, to bias voltage and e-radiation being applied in antiphase (i.e. one being gradually increased while the other being gradually decreased), the electrical properties of the layer of interest (e.g. electrostatic potential, or potential gradients) at a certain z-location can be extracted. This is because each layer in the multi-layer sample responds by its characteristic XPS peak/line shift, thus enabling to identify/extract the response of the layer of interest by filtering out, from the detected effective response, the response of all layers other than the layer of interest. Then, if needed, said layer can be laterally scanned by modulating local potential with modulated illumination or focused e-radiation to extract the potential profile across the specific layer.

Non-top-contact tests of the integrity of electrical conduction lines can be implemented as follows. In some embodiments, this is performed using side contact(s) and application of modulated wide beam e-radiation (of electron flood gun) and detection of peak shifts in the measured XPS spectral response (photoelectron emission spectra), or by using application of modulated focused e-radiation (e.g., e-beam pulses) and detection of electron-beam-induced current.

Figure 3E:
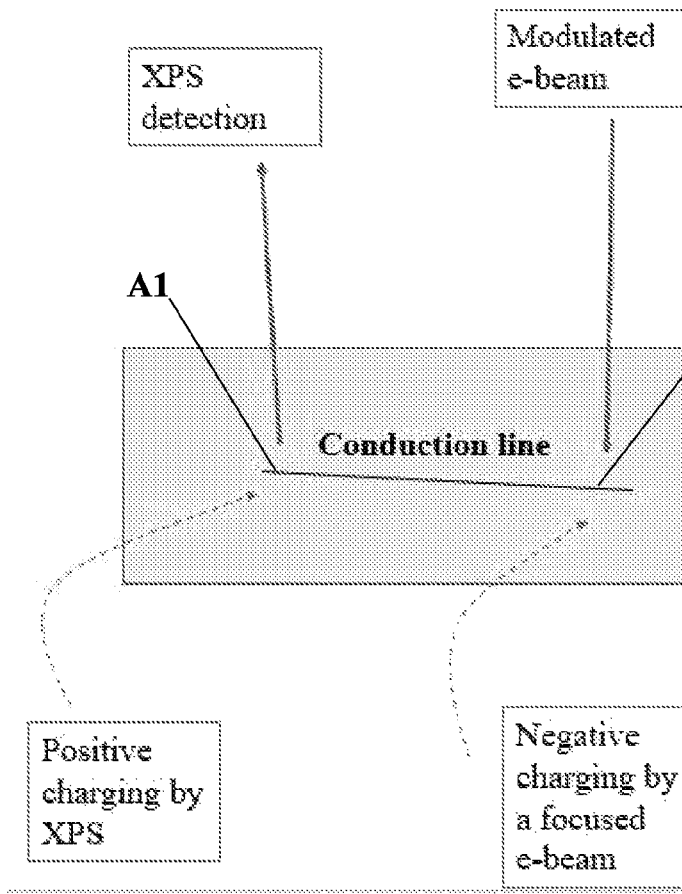

In some other embodiments, such tests can be performed without side contacts. In this connection, reference is made to FIG. 3E schematically illustrating the principles of such measurements. The XPS-based measurement according to the technique of the invention is performed on a given area/region A1 (spot $R_3$ in FIGS. 3B and 3C) to detect signals, while positive charging is the natural situation in this case. In general, a focused electron beam would alter the charging conditions locally, and this effect should be detectable by the CREM-based system of the invention described above. If the focused e-beam is located on a distant point/region A2 (spot $R_3'$ in FIGS. 3B and 3C), its effect on the XPS response of region A1 is by far smaller, unless there is good electrical conductivity. Therefore, a conduction line should respond to the imported charge promptly, even at a relatively large distance. In order to better resolve the effect, the focused e-beam can be modulated. Optionally, a second modulation can be introduced (e.g. modulated focused light beam) to better resolve the specific area of interest (within the larger XPS analysis area).

Figure 4A:
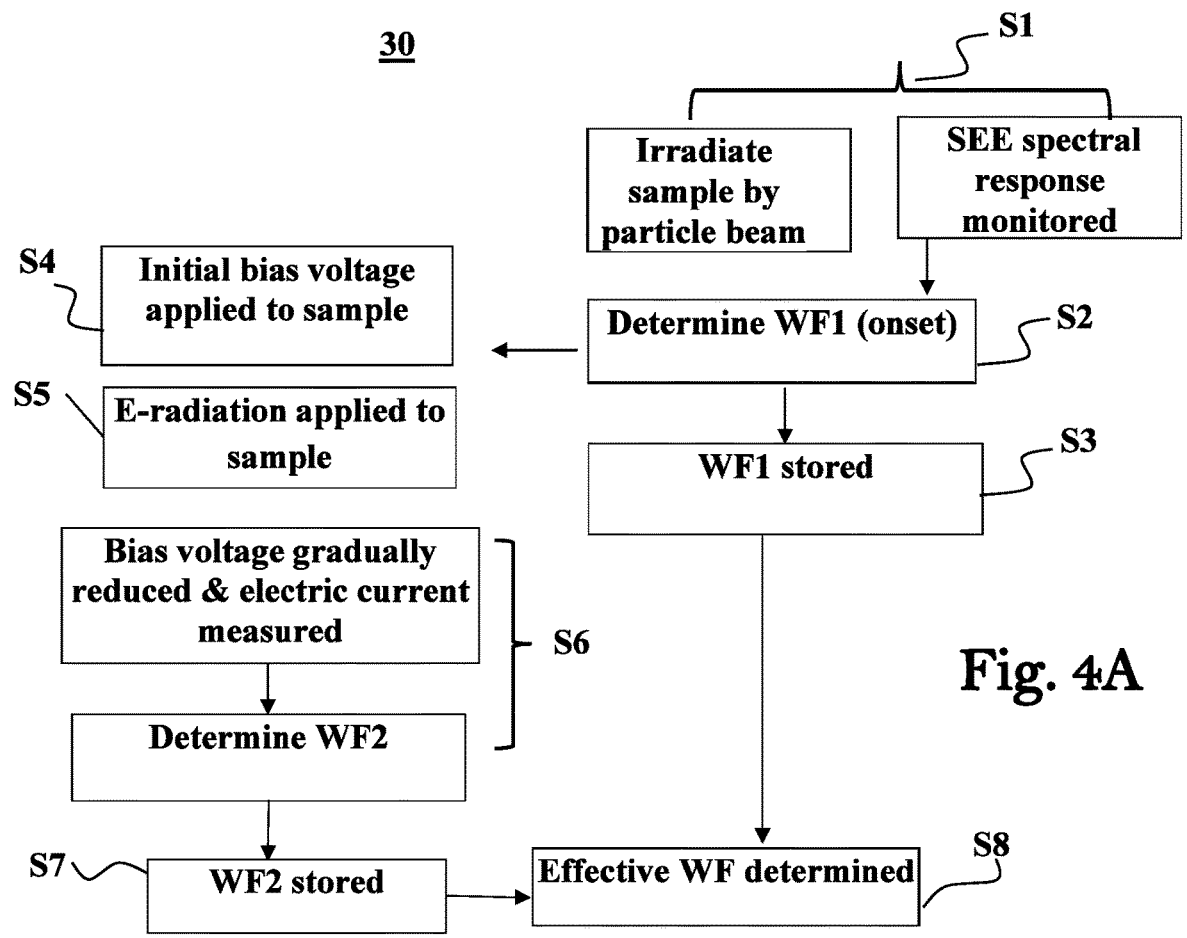
FIGS. 4A to 4D exemplify the use of the technique of the present invention for work function determination and leakage tests process, where
Figure 4B:
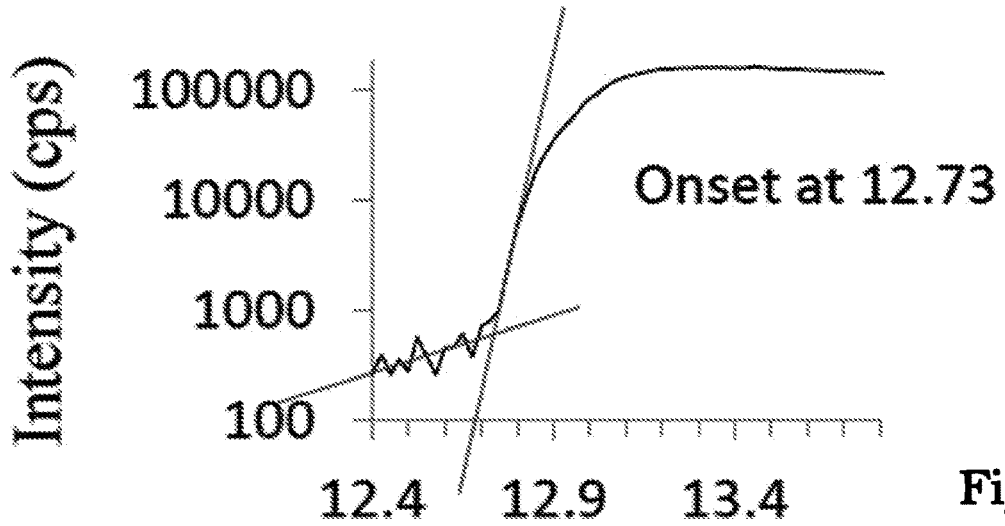
Figure 4C:
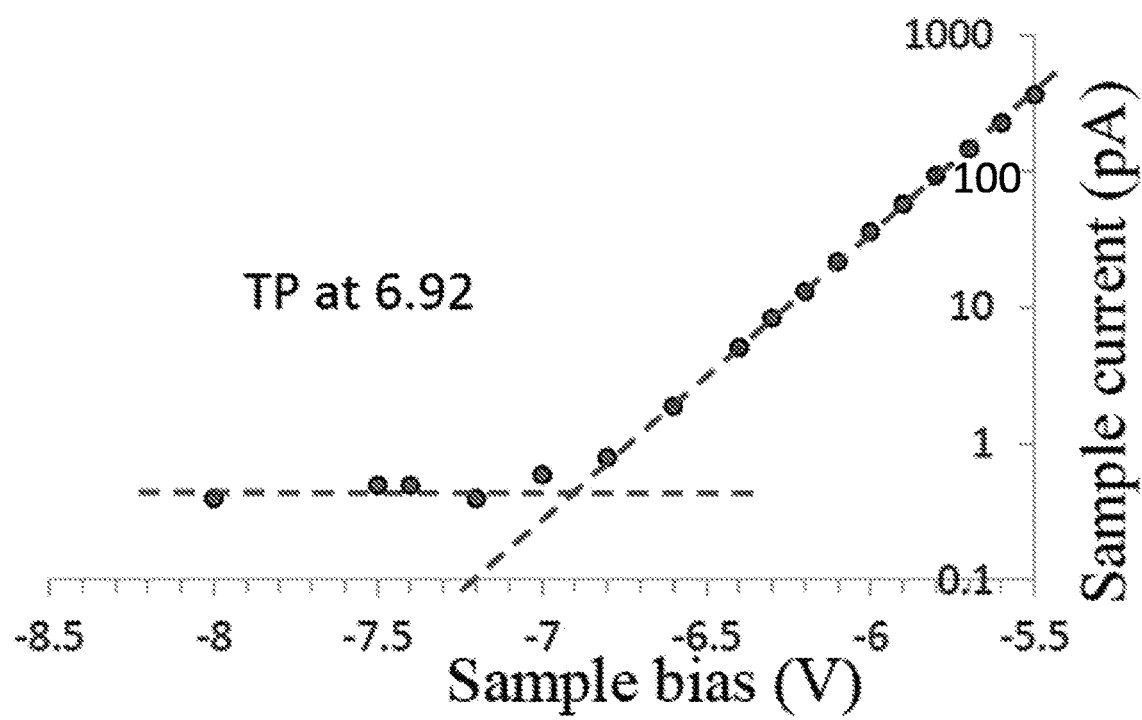

Reference is now made to FIGS. 4A to 4D exemplifying the use of the technique of the present invention for work function determination and leakage tests process 30. FIG. 4A shows a flow diagram 30 of this process, FIGS. 4B and 4C show the work function measure plots, and FIG. 4D exemplifies the leakage measurement.

In this embodiment, excitations applied to the sample may not be modulated at all, although the use of multiple modulations provides in some cases for determination of the work function profile across the sample. The measurement session for work function measurements includes sequentially performed first and second measurement modes to compensate for artefacts existing in each of these modes (and, also, determining artifact associated error magnitudes).

The process 30 starts in step S1 in which the control unit 15 operates the system to implement the first measurement mode to determine a first measure of the work function of a sample. To this end, the control unit generates control signals 22c for operating the high energy source (e.g. X-ray source) to apply X-ray radiation of a relatively low flux to the sample and monitoring secondary electron emission (SEE) spectral response of the sample. This enables to detect a low kinetic energy onset of the spectral response (step S2) as shown in FIG. 4B. This onset is indicative of a first measure of a work function WF1 of the sample. The first measure of the work function WF1 may be stored in a memory—step S3.

Then, the control unit 15 operates to switch to the second measurement mode. To this end, initial bias voltage is applied to the sample (step S4) and the X-ray excitation is replaced by an exposure to a source providing a flux of relatively low-energy electrons (step S5). Initially, the sample bias voltage is set to high negative values, such as to prevent from electrons emitted from the electron source to reach the sample. Then, the sample bias is gradually reduced and electric current through the sample is monitored (step S6). This enables to detect a turning point (TP) in the bias voltage corresponding to the conditions at which electrons from the external source start to land on the sample and being indicative of a second measure of a work function of the sample as shown by the graph in FIG. 4C. The second measure of work function WF2 may be stored (step S7).

The first and second measures of the work function WF1 and WF2 are then analyzed by the control unit to determine the effective (charging-free) work function WF of the sample (step S8). This may include determination of an average value, or may also take into account the evaluation of artefact-related errors, as determined by the difference between first and second measures.

It should be noted, although not specifically shown, that in some embodiments, two or more measurement sessions can be sequentially performed, resulting in alternatingly performed first and second measurement modes. This enables to determine charge trapping efficiencies of the sample. Hence, approximate evaluation of electron and hole trap densities can be performed.

The work function measurements may also be used to detect electric charge leakages from capacitive elements in a sample and gate insulating layers in particular. The leakage can be identified via slight changes in the work function determined over time as the capacitive elements discharge spontaneously. For example, this can be implemented using repetitive performance of either one of the above-described measurement modes.

Figure 4D:
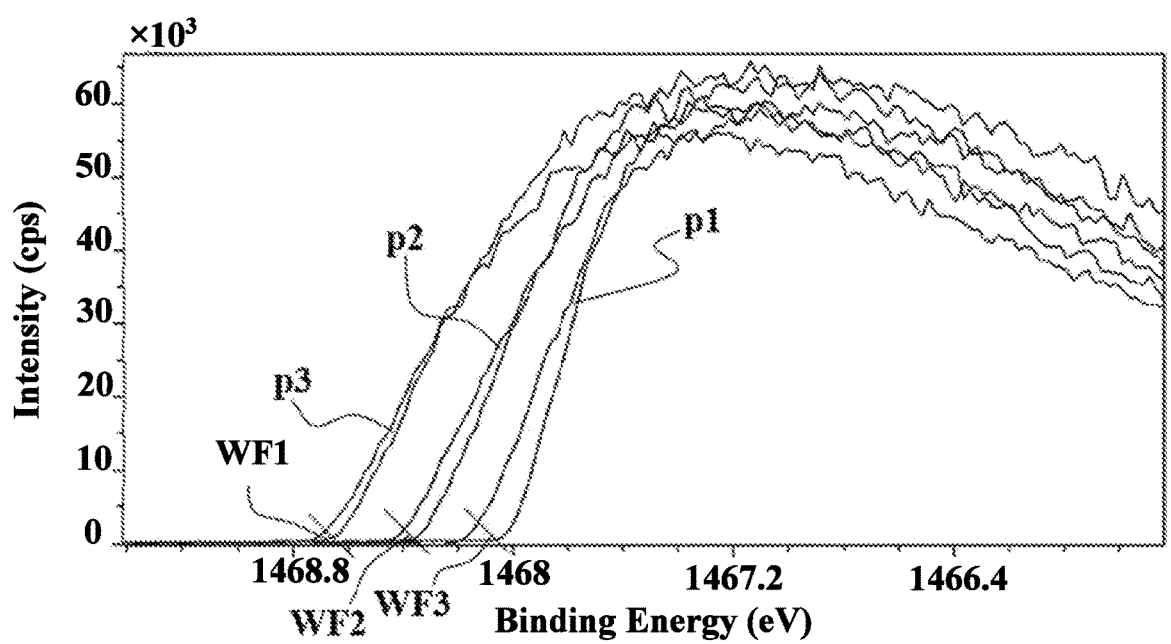

FIG. 4D illustrates characteristic line plots p1, p2 and p3, each consisting of two scans, presented on a binding-energy scale, showing a gradual decrease in the work function measures WF1, WF2, WF3, obtained during repetitive measurements over time as the tested capacitive elements undergo charge leakage to ground.

Figure 5:
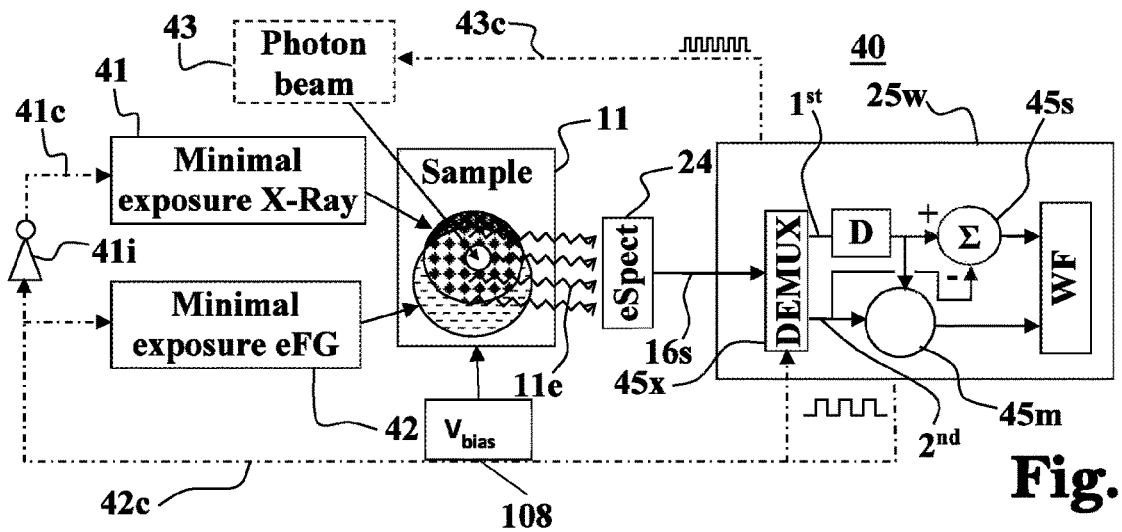
FIG. 5 is a block diagram schematically illustrating an example of a refined WF measurement process according to some possible embodiments of the invention.

Reference is made to FIG. 5 illustrating, by way of a block diagram 40, an example of the technique of the present invention for a refined work function determination process, performed by the work function determination unit 25w of the probe 25. In this work function determination process, the modulated excitation used in a measurement session is a time pattern of the exciting signals generated by the high energy (X-ray) particles source 41 and the low energy electrical charge (eFG) source 42 which are operated in an alternating fashion to alternatingly affect the sample's excitation by a minimal dose of x-rays and of low-energy electrons. This is schematically illustrated in FIG. 5 by the rectangular waveform control signal 42c directly operating the low energy electrical charge (eFG) source 42, and the high energy (x-ray) radiation source via the inverter circuitry 41i for generating the control signals 41c of the high energy particles source i.e., during exposure to the high energy particles the exposure to the low energy particles is halted, and vice versa.

The low- and high-energy particle sources, 41 and 42, are selected to affect electric charge state of the sample at opposite directions. For example, and without being limiting, the excitation of the electrons using X-ray exposure typically charges the sample positively, as photoelectrons are emitted therefrom, while exposure to the eFG negatively charges the sample.

The control signal 42c may be generated by the work function determination unit 25w or the control unit 15, and can be configured with a certain duty cycle to provide in each exposure cycle different exposure time intervals in which the sample is exposed to the low- and high-energy particle sources. If the refined work function determination process is required to inspect very small portions of the examined sample 11, the fast modulation photon beam 43 (indicted by dashed box lines) may be activated by control signals 43c for periodically illuminating a very small portion of the examined sample 11 during the low- and high-energy exposures; an action that in some samples can modify the onset energy and/or turning point. The control signal 43c may be generated by the work function determination unit 25w or by the control unit 15.

The kinetic energy of electrons 11e emitted from the examined sample 11, and their rate at each energy level, are measured by the electron spectroscope (eSpec) 24 and then supplied to the work function determination unit 25w. If optical illumination 43 is also used, the measurement results 16s are demodulated/differentiated (e.g., using subtractor 15c of FIG. 2C) to extract the information associated with the small portion of the sample 11 illuminated by the light source.

In the work function determination unit 25w the measurement results 16s obtained during the exposure to the low-energy electron source (e.g. eFG) and the high-energy photon source (e.g., X-ray or UV ionizing radiation) are considered to provide refined measurement results. This is illustrated in FIG. 5 by the summation unit 45s configured to subtract the measurements obtained during the low- and high-energy exposures one from the other, and the averaging unit 45m configured to calculate an average value measurements obtained during the low- and high-energy exposures. A demultiplexer 45x configured to receive the measurement results 16s in its input terminal, and the control signal 42c as an output selection signal, can be used to selectively provide the measurement results 16s over $1^{st}$ or $2^{nd}$ feed line thereof. A delay unit (D) may be used in one of the $1^{st}$ or $2^{nd}$ feed lines to cause subtraction and averaging of the results 16s obtained during the exposure to the low-energy source (e.g. electron source) and high-energy source (X-ray or ion beam source).

Due to the opposite electrical charging effects of the low- and high-energy sources, 41 and 42, and the use of minimal exposure conditions therein, the averaging of the measurement results 16s obtained during the low- and high-energy exposures substantially cancels the electrical charging artifacts induced by the measurement system. The subtraction of the measurement results 16s obtained during the low- and high-energy exposures one from the other can be used to define an evaluated error range of the refined work function measurement process. If photon illumination is utilized, the location of the photon illumination on the sample 11 can be changed after completing each WF measurement process into new locations of the sample 11 for carrying out additional WF measurement processes, until the entire/substantial or all relevant portions of the sample 11 are tested.

Figure 6A:
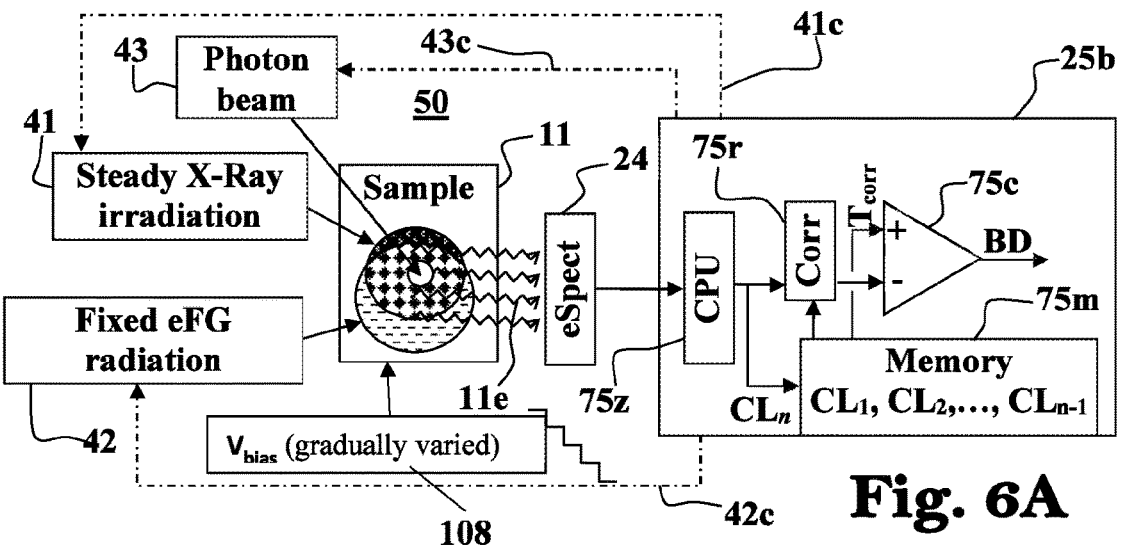

Referring to FIG. 6A there is illustrated, by way of a block diagram 50, an example of a soft breakdown test process as used in some embodiments in the soft breakdown test unit 25b of the probe 25. In this test process, the examined sample 11 is continuously irradiated by steady high energy particles beam 41 (X-ray beam) and by a low-energy electron beam 42 (wide electron beam) operated under fixed conditions. Then, the sample bias is gradually varied towards increased positive values. For a perfect insulator, a characteristic signal of its surface should remain unaltered during this process. Thus, the BD voltage is determined by the bias value at which spectral distortions indicative of potential drops across the insulating layer are detected. In order to capture the BD phenomena slightly below the bare BD voltage, a second signal is implied in a modulated manner, for example a light illumination source which exploits the fact that, slightly below BD, the photoconductivity too of the layer undergoes an abrupt increase. Moreover, if the second input signal is a focused beam, the pre-BD point may be evaluated from a small spot and, subsequently, be scanned across a large area.

A processing unit 75z may be used for constructing from the measurement data/signals 16s obtained at each electric charging level a respective characteristic line $CL_1$, $CL_2$, . . . , $CL_n$ (n is an integer), which are stored in the memory device 75m. A cross-correlation unit 75r can be used to generate for each newly generated characteristic line $CL_n$ a cross-correlation measure indicative of a degree of correlation between said newly generated characteristic line $CL_n$ and one or more of the other, e.g. previously generated characteristic lines $CL_1$, $CL_2$, . . . , $CL_{n-1}$ stored in the memory 75m. A comparator 75c can be used to compare each cross-correlation measure produced by the cross-correlation unit 75r to a correlation threshold value $T_{corr}$ stored in the memory 75m, and produce a breakdown indication BD as a reference for the cross-correlation measure produced by the cross-correlation unit 75r thus identifying the conditions at which the correlation threshold value $T_{corr}$ is crossed.

Figure 6B:
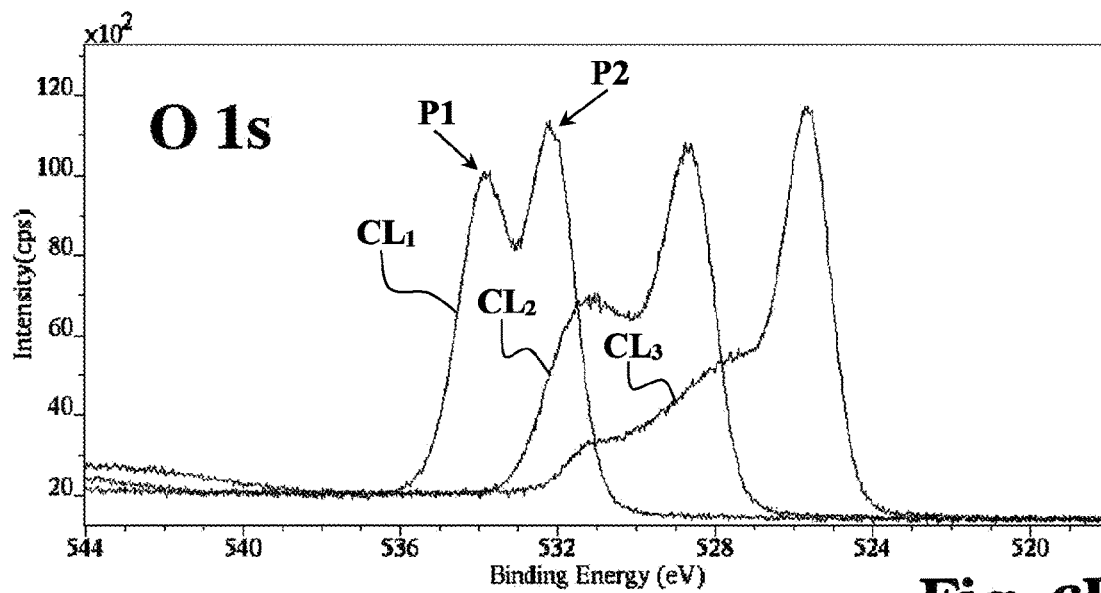

FIG. 6B shows three characteristic line plots $CL_1$, $CL_2$, $CL_3$, generated by the processor 75r for three different electric states of the sample 11 dictated by the variable bias voltage supply 108. The first characteristic line plot $CL_1$ is generated for a first electric state of the sample, which is thereafter increased by a predetermined amount Δv for generating the second characteristic line plot $CL_2$, which is thereafter increased once more by the predetermined amount Δv for generating the third characteristic line plot $CL_3$. As seen, while the electrical state of the examined sample 11 is increased, the respective characteristic line plot $CL_1$ (where 1≤i≤n is an integer) generated by the processor 75z is respectively shifted to lower binding energy values.

As also seen in FIG. 6B, in each of the generated characteristic line plots $CL_1$ there are two peaks, P1 and P2, each of which is indicative of a certain spatial domain in the examined sample 11. As the electric field across the sample 11 is increased, the first peak P1 broadens gradually due to potential gradients evolving within the corresponding sample's regime, until it loses the regular shape and develops a double-peak shape, $CL_3$. At the same time, the second peak, P2, undergoes shifts with no broadening. The cross-correlation unit 75r, comparator 75c and correlation threshold value $T_{corr}$, are configured to identify such peak distortions in the generated characteristic line plots $CL_1$ as pre-breakdown spectral distortions at relatively early stages, and responsively issue the breakdown indication BD before the examined sample 11 is damaged. In order to avoid damaging the examined sample 11, these measurements are carried out via application of the light beam, to thereby enable determining the BD point of the examined sample below the conditions at which irreversible damage is induced.

As in the previously described embodiments, if the breakdown test process should be confined to a very small portion of the examined sample, the measurements can be carried out with periodic excitation of the examined sample 11 by a focused beam, e.g. the photon or electron source 43. Accordingly, control signal 43c may be generated by the breakdown test unit 25b, or by the control unit 15, for periodically illuminating the examined sample 11. The soft breakdown test arrangement of FIG. 6A may accordingly comprise a comparator 15c, as used in the probe unit 25 shown in FIG.

3C to extract from the measurements results the information associated with the small portion of the sample illuminated by the focused beam. The location of the photon illumination on the sample 11 can be changed (e.g. after completing each breakdown test process) into new locations of the sample for carrying out additional breakdown test processes, until all relevant portions of the sample are tested.

Figure 7A:
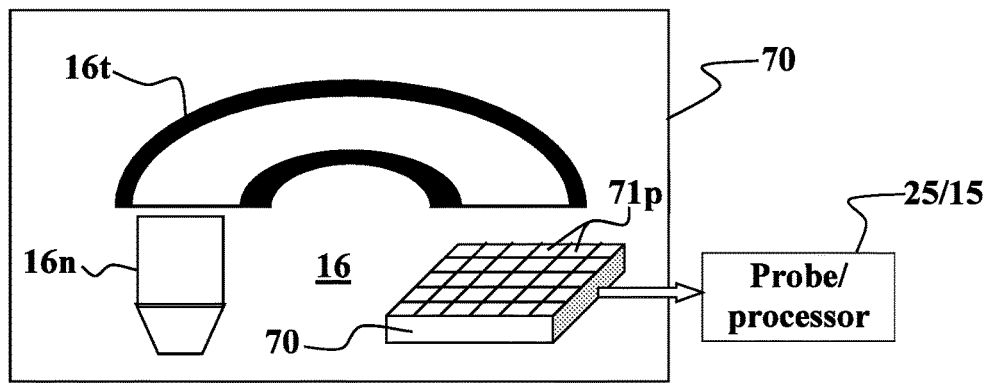

FIG. 7A schematically illustrates an electron energy analyzing and detection system 70 configured to measure characteristic lines of emitted electrons within a single measurement session, a so called parallel detection, i.e., not requiring the repetitious energy level scan process. The electron energy analyzing and detection setup 70 comprises the conventional retarding/focusing input electron lens assembly 16n and concentric hemispherical electron analyser assembly 16t, as described hereinabove, and an electron detection assembly 70 comprising an array/matrix of sensor elements 71p (e.g., comprising a row of 128, or more, sensor elements). Each of the sensor elements 71p electron detection assembly 70 is configured to detect photoelectrons exiting the concentric hemispherical electron analyser assembly 16t and generate respective signals/data indicative of the amount of electrons received therein and their energy level according to its relative location within the array/matrix.

A constant electric field can be applied by the concentric hemispherical electron analyser assembly 16t for bending electron orbits that pass thereto from the retarding/focusing input electron lens assembly 16n as they are passing through the analyser assembly 16t. The applied constant electric field can be configured to bend the orbit of electrons having a certain range of kinetic energies such that electrons reaching the exit port of the concentric hemispherical electron analyser assembly 16t become spatially distributed between edges of the exit port according to their kinetic energies i.e., within the certain range of kinetic energies. Particularly, photoelectrons having higher kinetic energy will exit the electron analyser assembly 16t closer to its outer arc, while the less energetic photoelectrons will exit the electron analyser assembly 16t closer to its inner arc.

Figure 7B:
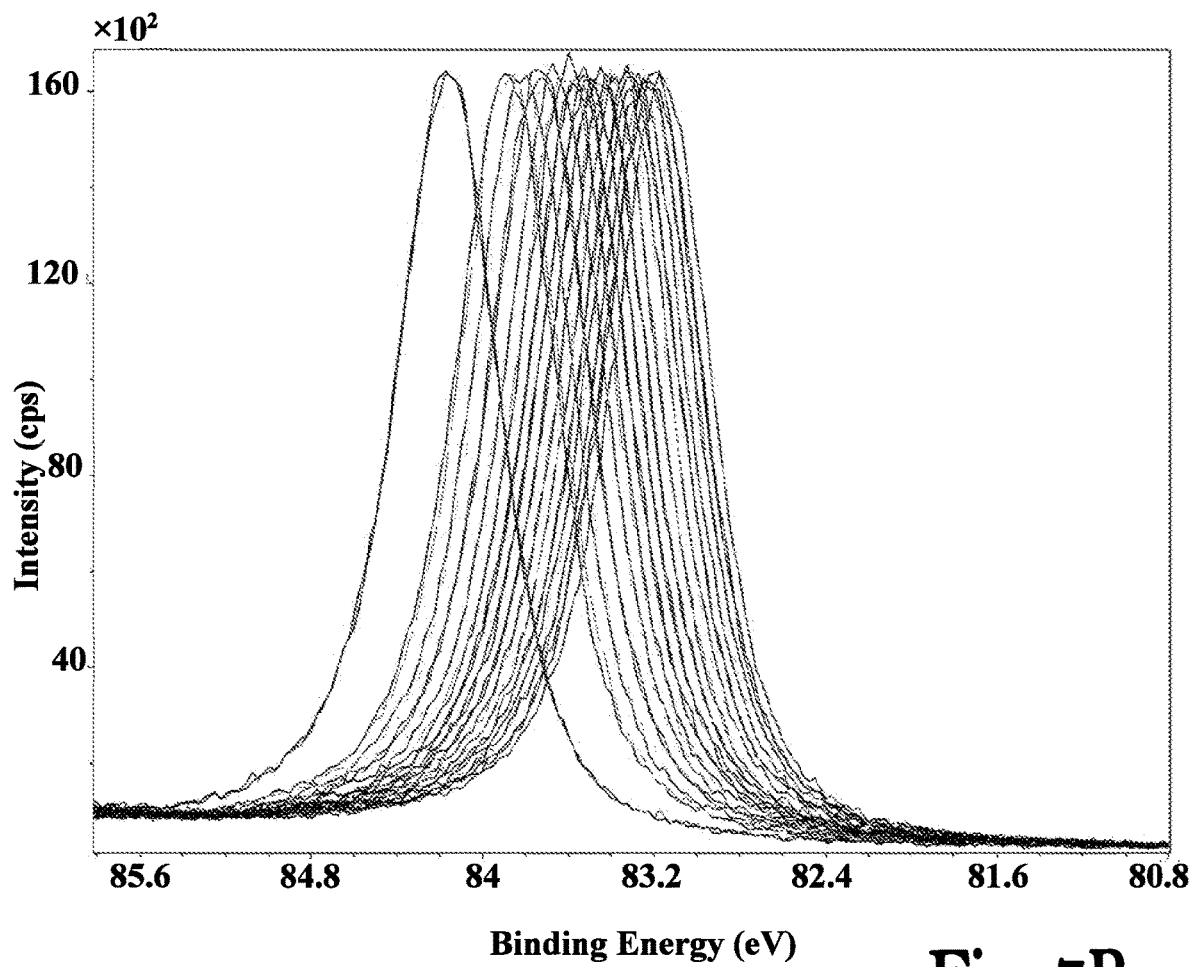
Figure 7C:
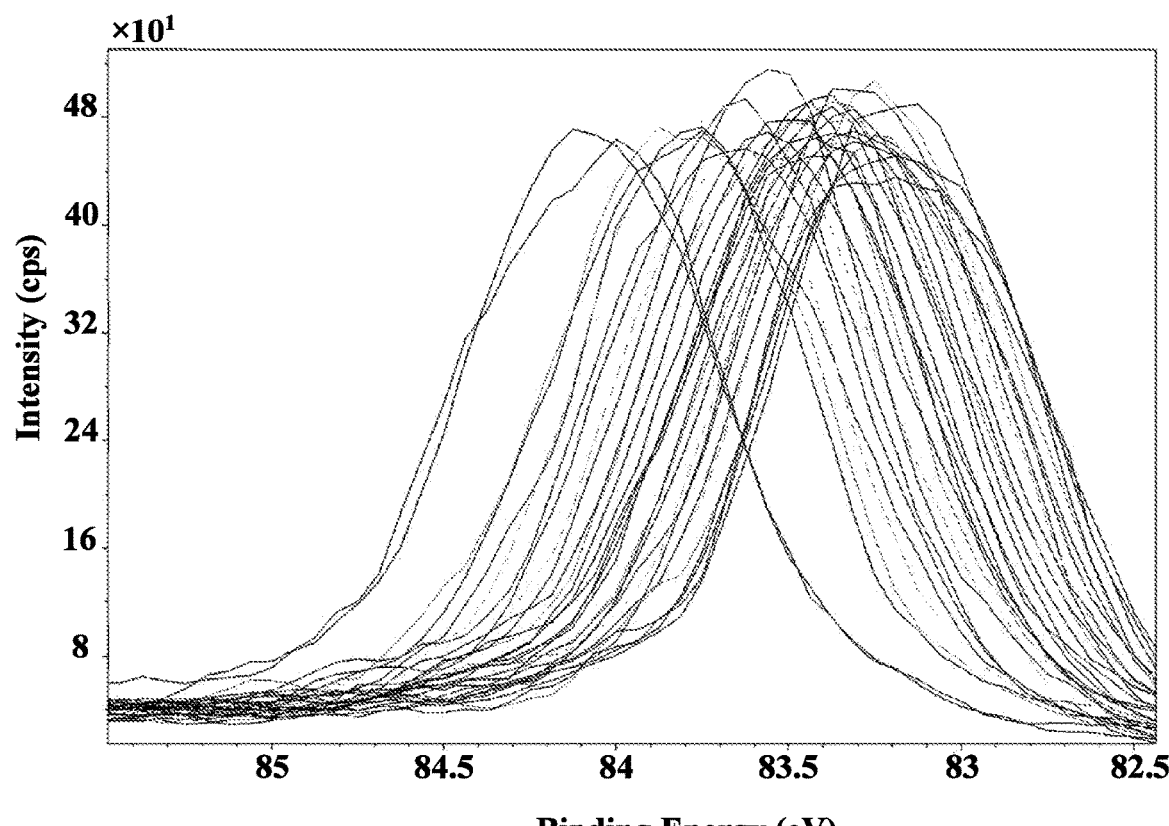

In order to exemplify the spectral quality under enhanced measurement speed, FIG. 7B shows a set of spectra, recorded under varied sample charging conditions by means of a standard spectroscopic scan in the detection setup of the spectrometer, whereas FIG. 7C shows a set of spectra under the same sample charging condition, however recorded by means of the 'parallel detection' setup, thus gaining a factor of 100 in measurement speed. The quality of spectra in FIG. 7C is not as good as in FIG. 7B, however it is sufficiently good to determine line-shifts induced by the charging source.

Figure 8:
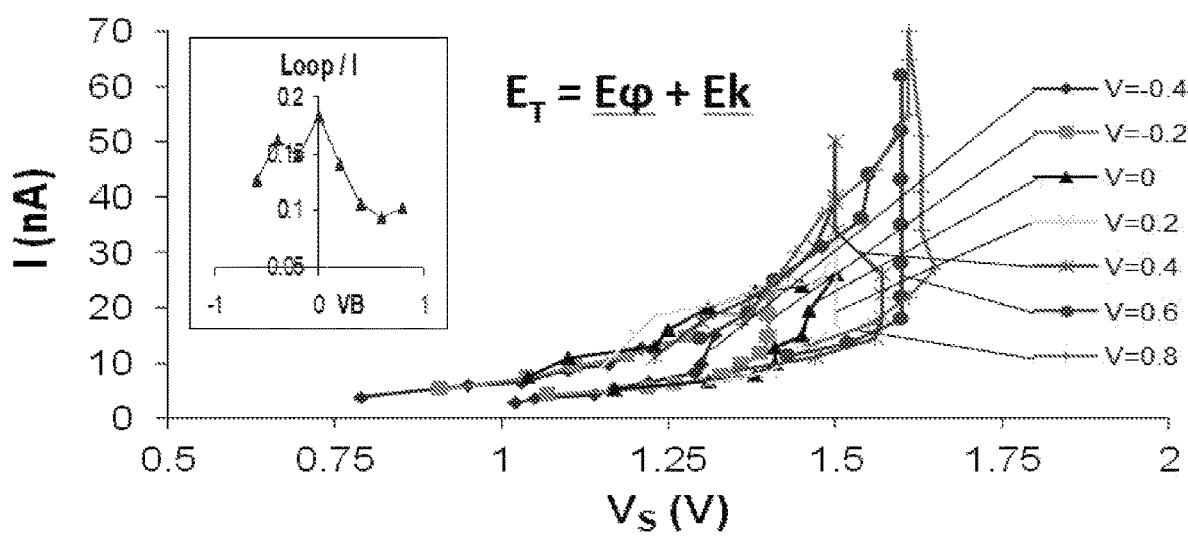
FIG. 8 exemplifies use of the technique of the invention for measuring non-conventional I-V-V characteristics of a sample, where the current is measured on the sample back contact, the first voltage relates to measured surface potential and the second voltage relates to the kinetic energy of eFG electrons.

Reference is made to FIG. 8 exemplifying a measurement combining a specific configuration of I-V and V-V characteristics of the inspected sample. In this example, the sample is a structure consisting of a $SiO_2$ layer on a Si substrate. The measurements are aimed at extracting information on charge traps and their energy levels in the bandgap of the $SiO_2$ layer. The figure shows seven curves, where each curve is an I-V plot recorded under varied flux, yet fixed kinetic energy, of the electrons provided by the low-energy broad-beam source of electrons (eFG). More specifically, two (slow) modulations have been applied during the measurements via eFG parameters: a step-wise variation of the filament current in the eFG, and a step-wise variation (slower) of the sample bias $V_B$. The current I through the sample is plotted as a function of sample's voltage $V_S$ (determined from the shifts in the O 1s line in the detected photoelectron spectrum), where both I and $V_S$ vary in response to changes in the eFG parameters and the sample bias. The shape of these curves (plotted on a log-intensity scale) expresses hysteresis, namely a loop-like shape. The difference between the various I-V curves is due to controlled changes in the kinetic energy of the electrons provided by the electron source, the parameters of which being fixed for each curve in a controllable manner. To mention just one feature proposed by this combined plot, the dependence of curve hysteresis on the kinetic energy of the electrons is a feature that can be modelled to yield information on the charge traps and their energy levels in the inspected sample.

The above described aspects of the invention, relating to the multiple-modulation excitation, as well as those of the combined electron-out and electron-in based measurements of work function that may or may not utilize modulated excitation(s), can be advantageously used in an automatic inspection/metrology applied to samples, e.g. samples projecting on a production line, which is particularly useful in the semiconductor industry.

More specifically, each FAB typically performs inspection of wafers before and after most of manufacturing processes applied to the wafers. Such inspection stages include automatic inspection and metrology, e.g. optical inspection or electron beam inspection, to identify "potentially defected" samples, for which defects are then verified by data processing which needs to be within the required limits of the inspection/metrology system, in order to remove (sort out) the really defected sample from the production line and/or provide control data for adjusting the operational parameter(s) of the manufacturing process that might have been a source of those real defects.

The measurement technique of the present invention can be used as a part of the automatic optical inspection station for inspecting articles of the type that can be electrically charged, or may be used as an additional verification station, prior to the data processing verification, and in order to reduce the unnecessarily manual inspection. Indeed, some of the "potentially defected" samples identified by optical techniques might appear to be non-defective in their electric properties, which might be indicative of the fact that "optical defects" are insignificant or false defects.

Further, machine learning techniques can be used to determine a relation between radiation signatures corresponding to the above-described combined effective response of given samples obtained during measurements with predetermined sets of excitation conditions and electric or material-related properties of the samples, to create a database of related optical and electric/material properties of the samples. This database can then be used for automatic inspection, during which the signature for a certain sample is measured under certain excitation conditions as described above, and a matching set of sample's parameters is obtained from the database.

Thus, the present invention provides novel approaches for various XPS-based measurements, and their advantageous use in various industrial applications.

It should also be understood that throughout this disclosure, where a process or method is shown or described, the steps of the method may be performed in any order or simultaneously, unless it is clear from the context that one step depends on another being performed first. Those of skill in the art would appreciate that items such as the various illustrative blocks, modules, elements, components, methods, operations, steps, and algorithms described herein may be implemented as hardware or a combination of hardware and computer software. To illustrate the interchangeability of hardware and software, items such as the various illustrative blocks, units, modules, elements, components, methods, operations, steps, and algorithms have been described generally in terms of their functionality. Whether such functionality is implemented as hardware or software depends upon the particular application and design constraints imposed on the overall system. Skilled artisans may implement the described functionality in varying ways for each particular application.

Functions of the measurement setups described hereinabove may be controlled through instructions executed by a computer-based control system which may be part of the control unit and/or probe unit. A control system suitable for use with embodiments described hereinabove may include, for example, one or more processors connected to a communication bus, one or more volatile memories (e.g., random access memory—RAM) or non-volatile memories (e.g., Flash memory). A secondary memory (e.g., a hard disk drive, a removable storage drive, and/or removable memory chip such as an EPROM, PROM or Flash memory) may be used for storing data, computer programs or other instructions, to be loaded into the computer system.

In an embodiment where the invention is implemented using software, the software can be stored in a computer program product and loaded into the computer system using the removable storage drive, the memory chips or the communications interface. The control logic (software), when executed by a control processor, causes the control processor to perform certain functions of the invention as described herein.

As described hereinabove and shown in the associated figures, the present invention provides electron spectroscopy measurement techniques for inspecting specific atomic layers of a sample and related methods. Yet, it can sometimes provide electrical information on regimes buried much deeper within the heterostructure. While particular embodiments of the invention have been described, it will be understood, however, that the invention is not limited thereto, since modifications may be made by those skilled in the art, particularly in light of the foregoing teachings. As will be appreciated by the skilled person, the invention can be carried out in a great variety of ways, employing more than one technique from those described above, all without exceeding the scope of the claims.

The invention claimed is:

1. A measurement system for measuring a sample, the measurement system comprising:
    an excitation system comprising a plurality of excitation sources generating excitations of different types comprising: a high energy radiation source generating high energy radiation and at least one of the following: at least one relatively low-energy particles' source generating at least one wide beam; at least one electron beam source generating e-radiation in the form of a focused electron beam; a light source generating illumination including one or more optical beams; and at least one electric power supply providing a bias voltage to a sample;
    a signal modulation system associated with at least two of said excitation sources, thereby providing that each of at least two respective excitations is a modulated excitation having a predetermined modulation profile during each of at least one measurement session, such that the excitations of the different types including the at least two modulated excitations, when concurrently applied to at least a region of the sample, differently affect said at least region of the sample inducing responses of the sample including responses to the different modulated excitations indicative of various different information pieces about the sample, forming together a combined effective response of the sample embedding multiple data about the sample;
    a detection system comprising at least an electron spectrometer and being configured and operable for detecting the effective response of said at least region of the sample to the multiple excitations including said at least two modulated excitations and generating measured data indicative of the detected effective response, which is indicative of a modulated change of electrical state of at least said region of the sample;
    a control unit configured for signal communication with the detector to process the measured data, utilizing modulation data about the predetermined modulation profile for each of said at least two modulated excitations, and determine one or more of the parameters/conditions of said at least region of the sample.

2. The system according to claim 1, wherein: the high energy radiation source comprises at least one of X-ray source and electron beam source configured and operable for irradiating a surface region of the sample and causing emission of electrons therefrom.

3. The system according to claim 1, wherein said at least one relatively low-energy particles' source comprises at least one of electron beam source and ion beam source.

4. The system according to claim 1, wherein the control unit is configured and operable to operate the excitation system and the modulation system to concurrently excite at least a portion of the sample by the high energy radiation and excite at least one spot within said at least portion by either one or both of the focused electron beam and the focused illumination.

5. The system according to claim 1, wherein the control unit is configured and operable to utilize the modulation data used to generate said at least two modulated beams, and demodulate the measured data to extract therefrom information about the sample.

6. The system according to claim 3, wherein the control unit is configured and operable to demodulate the measured data to extract therefrom data associated with the excited location of the sample.

7. The system according to claim 1, wherein the modulation system is configured and operable to modulate at least one of the exciting signals, the detected effective response being indicative of one or more of the following properties of said at least region of the sample: conduction integrity of leads; work function; combined optical and electrical measurement results.

8. The system according to claim 1, wherein the modulation system is configured and operable to modulate the at least two of the exciting signals, the detected effective response being indicative of one or more of the following properties of said at least region of the sample: I-V and V-V characteristics; vertically and/or laterally resolved electrostatic potential: chemical analysis results of a small spot in said region: soft breakdown of elements.

9. The system according to claim 1, wherein the wide beam, when modulated, has one or more of the following modulations: current amplitude modulation at a certain frequency; landing energy modulation at a certain frequency.

10. The system according to claim 1, wherein the illumination includes at least one optical beam, which when modulated, has at least one of the following modulations:

wavelength modulation around a selected wavelength, polarization modulation, amplitude modulation, temporal frequency modulation.

11. The system according to claim 1, wherein the optical light source system is configured and operable to produce the illumination in the form of two or more optical beams differing from one another in at least one of the following parameters: wavelength, amplitude, polarization, temporal frequency.

12. The system according to claim 1, wherein the electric power supply is operable by the modulator to produce modulated biasing voltage according to a predetermined time function.

13. The system according to claim 1, wherein the electron source is configured and operable by the modulator to produce the modulated focused electron beam for exciting a region of the sample containing, or at least partially intersecting with, a surface portion of the sample excited by the high energy radiation.

14. The system according to claim 4, wherein the illumination is modulated to periodically excite the spot in said portion of the sample.

15. The system according to claim 1, wherein the excitation system and the modulation system are configured and operable to produce first and second focused beams for exciting first and second distant regions of the sample, wherein at least one of said first and second beams is modulated and wherein one of the first and second spots is contained or at least partially intersects with a surface portion of the sample excited by the high energy radiation.

16. The system according to claim 1, wherein the excitation system and the modulation system are configured and controllably operated to provide multi-parameter modulation of the excitation signals to thereby determine a two-dimensional or three-dimensional map of chemical composition and/or electrical properties of the sample.

17. The system according to claim 1, wherein the excitation system and the modulation system are configured and operable to excite a relatively small region of the sample by modulated focused excitation including at least one of the electron beam and the illumination within a relatively large portion of the sample excited by either one or both of the high energy radiation and the wide charged particle beam, thereby inducing modification of an effective voltage of said relatively small region and enabling extraction of contribution of said region in the detected effective response of the sample.

18. The system according to claim 1, configured and operable to measure chemical and/or electrical properties of a selected domain in the sample, said excitations comprising a pattern of applied excitations formed by a combination of phase differences and modulation frequencies of the excitations of different types, thereby enabling to extract from the effective response of the sample characteristic X-ray photoelectron spectroscopy (XPS) line shifts indicative of said selected domain.

19. The system according to claim 18, wherein said combination of phase differences and modulation frequencies of the excitations of different types comprises the bias voltage and the wide beam e-radiation gradually changing in opposite directions w % bile exciting the sample concurrently with excitation of the sample with the high energy radiation.

20. The system according to claim 18, configured and operable to perform a lateral scan of said sample's domain, by applying either one or both of the modulated illumination and modulated focused e-radiation.

21. The system according to claim 1, wherein the detection system comprises a detector comprising an array of sensor elements each configured to generate measured data piece indicative of an amount of electrons emitted from the sample with a certain kinetic energy based on relative location of said sensor element in said array of sensor elements.

22. The system according to claim 1, wherein the detection system comprises an optical detector for detecting an optical response of the sample to the multiple excitations.

23. The system according to claim 1, comprising an illuminator and an optical detector configured and operable to perform optical measurements of the sample.

24. The system according to claim 23, wherein said illuminator comprises said light source unit for producing said exciting illumination.

25. A measurement system for measuring one or more parameters of a sample, the measurement system comprising:
an excitation system configured and operable to generate combined exciting radiation comprising multi-parameter modulation of multiple exciting signals of different types to be applied to at least a portion of a sample under measurements to thereby differently affect said at least portion of the sample by the multiple exciting signals of different types characterized by the multi-parameter modulation and induce electron emission response of said at least portion of the sample to said combined exciting radiation, said electron emission response being therefore indicative of various different information pieces about the sample;
a detection system for detecting the electron emission response of said at least portion of the sample and generating measured data indicative of a modulated change of an electrical state of said at least portion of the sample, thereby enabling to utilize predetermined modulation data about modulation profiles of the multi-parameter modulation of the multiple exciting signals of different types for determination of one or more parameters of the sample from said measured data.

26. The system according to claim 1, wherein the electron emission response is indicative of secondary electron emission from the sample induced by the combined excitation of the sample and a detectable change of an electric parameter of the sample being excited by said combined excitation.

27. A method for measuring parameters of a sample, the method comprising:
performing at least one measurement session on the sample and obtaining at least one corresponding measured data, wherein said performing of the measurement session comprises: concurrently exciting at least a portion of the sample by multiple excitations of different types comprising at least two modulated excitations, each having a predetermined modulation profile, such that the multiple excitations of the different types including the at least two modulated excitations differently affect said at least portion of the sample inducing responses of the sample including responses to the different modulated excitations indicative of various different information pieces about the sample, forming together a combined effective response of the sample embedding multiple data about the sample, said multiple excitations comprising high energy irradiation, and one or more of the following: at least one wide beam of relatively low-energy charged particles, e-radiation comprising a focused electron beam, illumination comprising one or more light beams, and an electrical power supply providing at least sample bias voltage; detecting the combined effective response of said at least portion of the sample to said multiple excitations indicative of at least electron emission of the sample; and generating the measured data indicative of the detected combined effective response, processing said measured data utilizing modulation data about the predetermined modulation profile for each of said at least two modulated excitations and determining one or more parameters of the sample within said at least portion of the sample.

28. The method according to claim 27, wherein the high energy radiation comprises X-ray radiation or electron beam radiation.

29. The method according to claim 27, wherein said at least one wide beam of relatively low-energy particles comprises at least one of electron beam and ion beam.

30. The method according to claim 27, comprising controlling the excitation and modulation procedures to concurrently excite at least a portion of the sample by the high energy radiation and excite at least one spot within said at least portion by either one or both of the focused electron beam and the illumination.

31. The method according to claim 27, wherein said processing comprises utilizing the modulation data used to generate the predetermined number of modulated beams, and demodulate the measured data to extract therefrom information about the sample.

32. The method according to claim 31, wherein said processing comprises demodulating the measured data to extract therefrom data associated with the excited location of the sample.

33. The method according to claim 27, wherein the detected effective response is indicative of one or more of the following properties of said at least region of the sample: conduction integrity of leads; work function; combined optical and electrical measurement results.

34. The method according to claim 27, wherein the detected effective response is indicative of one or more of the following properties of said at least region of the sample: I-V and V-V characteristics; vertically and/or laterally resolved electrostatic potential; chemical analysis results of a small spot in said region; soft breakdown of elements.

35. The method according to claim 27, wherein the wide beam has one or more of the following modulations: current amplitude modulation at a certain frequency; landing energy modulation at a certain frequency.

36. The method according to claim 27, wherein the illumination includes at least one optical beam having at least one of the following modulations: wavelength modulation, polarization modulation, amplitude modulation, temporal frequency modulation.

37. The method according to claim 27, wherein the illumination is in the form of two or more optical beams differing from one another in at least one of the following parameters: wavelength, amplitude, polarization, temporal frequency or phase.

38. The method according to claim 27, wherein the electric power supply comprises biasing voltage modulation according to a predetermined time function.

39. The method according to claim 27, wherein the at least one modulated beam, being electron beam or focused light beam, excites at least one region of the sample containing, or at least partially intersecting with, a surface portion of the sample excited by the high energy radiation beam.

40. The method according to claim 39, wherein the at least one modulated beam, being electron beam or focused light beam, excites at least one additional region of the sample located outside said surface portion of the sample excited by the high energy radiation beam.

41. The method according to claim 27, wherein the illumination is modulated to periodically excite the spot in said portion of the sample.

42. The method according to claim 27, wherein the excitation comprises first and second focused beams for exciting first and second distant regions of the sample, wherein at least one of the first and second beams is modulated and wherein one of the first and second spots is contained or at least partially intersects with a surface portion of the sample excited by the high energy radiation beam.

43. The method according to claim 27, wherein the excitation comprises multi-parameter modulation of the excitation signals to thereby determine a two-dimensional or three-dimensional map of chemical composition and/or electrical properties of the sample.

44. The method according to claim 27, wherein said at least one measurement session comprises exciting a relatively small region of the sample by modulated focused excitation including at least one of the electron beam and the illumination within a relatively large portion of the sample excited by either one or both of the high energy radiation and the wide charged particle beam, thereby inducing modification of an effective voltage of said relatively small region and enabling extraction of contribution of said region in the detected effective response of the sample.

45. The method according to claim 27, comprising measuring chemical and/or electrical properties of a selected domain in the sample, said excitations comprising a pattern of applied excitations formed by a combination of phase differences and modulation frequencies of the excitations of different types, thereby enabling to extract, from the effective response of the sample, characteristic X-ray photoelectron spectroscopy (XPS) line shifts indicative of said selected domain.

46. The method according to claim 45, wherein said combination of phase differences and modulation frequencies of the excitations of different types comprises the bias voltage and the wide beam e-radiation gradually changing in opposite directions while exciting the sample concurrently with excitation of the sample with the high energy radiation.

47. The method according to claim 46, wherein said measurement session comprises performing a lateral scan of said sample's domain, by applying either one or both of the modulated illumination and modulated focused e-radiation.

48. The method according to claim 27, wherein said detecting utilizes an array of sensor elements each configured to generate measured data piece indicative of an amount of electrons emitted from the sample with a certain kinetic energy based on relative location of said sensor element in said array of sensor elements.

49. The method according to claim 27, wherein said detecting further comprises detecting an optical response of the sample to the multiple excitations.

50. The method according to claim 27, further comprising performing optical measurements on the sample.

51. The method according to claim 27, comprising: sequentially performing two or more of the measurement sessions on the sample differing from one another by a combination of said multiple excitations of the different types and obtaining respective two or more corresponding measured data, each indicative of the detected combined effective response.

52. The method according to claim 27, wherein said sample comprises an integrated circuit structure.

53. The method according to claim 52, wherein said integrated circuit structure comprises a high-K dielectric layer.

54. The method according to claim 27, wherein said sample comprises a semiconductor wafer.

55. The method according to claim 27, wherein said sample comprises a patterned structure.

56. The method according to claim 55, wherein the patterned structure defines an array of memory cells.

57. The method according to claim 55, wherein the patterned structure defines an array of transistors of logic IC.

\* \* \* \* \*